(12) United States Patent
Mitani et al.

(10) Patent No.: US 7,075,182 B2
(45) Date of Patent: Jul. 11, 2006

(54) SEMICONDUCTOR DEVICE

(75) Inventors: Junichi Mitani, Kawasaki (JP); Yoshimori Asai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 94 days.

(21) Appl. No.: 10/968,167

(22) Filed: Oct. 20, 2004

(65) Prior Publication Data

US 2005/0236713 A1    Oct. 27, 2005

(30) Foreign Application Priority Data

Apr. 27, 2004    (JP)    ............................. 2004-130799

(51) Int. Cl.
*H01L 23/48* (2006.01)
(52) U.S. Cl. ................ 257/758; 257/774; 257/E21.585
(58) Field of Classification Search ................ 257/758, 257/774
See application file for complete search history.

(56) References Cited

U.S. PATENT DOCUMENTS 6,509,593 B1 *    1/2003    Inoue et al. ................ 257/295
6,815,328 B1 *    11/2004    Pio ............................. 438/618

FOREIGN PATENT DOCUMENTS

| JP | 2002-76048 | 3/2002 |
| JP | 2003-124249 | 4/2003 |
| JP | 2003-174105 | 6/2003 |
| JP | 2003-258090 | 9/2003 |

* cited by examiner

*Primary Examiner*—Roy Potter
(74) *Attorney, Agent, or Firm*—Westerman, Hattori, Daniels & Adrian, LLP.

(57) ABSTRACT

The semiconductor device comprises a first conductive pattern 42, a second conductive pattern 42 formed adjacent to the first conductive pattern 42, a first conductor plug 28 formed below a prescribed region of the first conductive pattern 42, a second conductor plug $62_n$ formed over a prescribed region of the first conductive pattern 42, a third conductor plug 28 formed below a prescribed region of the second conductive pattern 42, which is adjacent to a prescribed region of the first conductive pattern 42, a fourth conductor plug $62_{n+1}$ formed over a prescribed region of the second conductive pattern 42, a third conductive pattern 64 formed above the first conductive pattern 42 and connected to the second conductor plug 62a, and a fourth conductive pattern 64 formed above the second conductive pattern 42 and connected to the fourth conductor plug 62. The fourth conductor plug $62_{n+1}$ is arranged a position which is offset from the second conductor plug $62_n$. The conductor plugs $62_n$, $62_{n+1}$ are offset each other in the longitudinal direction of the interconnections, whereby the parts of the interconnections having an increased width can be distanced from each other. Thus, the interconnections can be arranged at a small pitch without using an ArF exposure system and a half tone phase shift mask, which are expensive. Accordingly, the semiconductor device of high integration is provided at low costs while ensuring high fabrication yields.

15 Claims, 32 Drawing Sheets

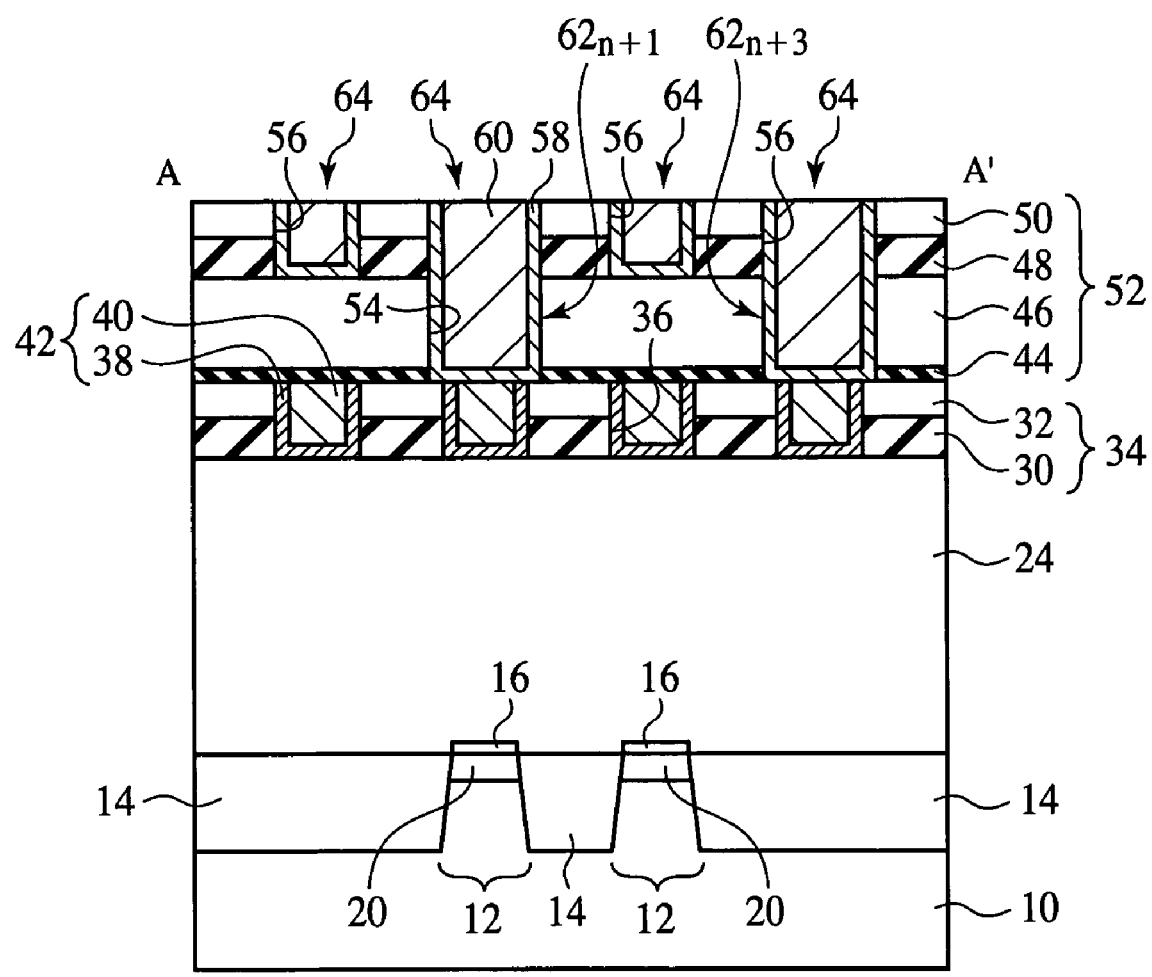

SEMICONDUCTOR DEVICE

CROSS-REFERENCE TO RELATED APPLICATION

This application is based upon and claims priority of Japanese Patent Application No. 2004-130799, filed on Apr. 27, 2004, the contents being incorporated herein by reference.

BACKGROUND OF THE INVENTION

The present invention relates to a semiconductor device, more specifically a semiconductor device having narrow pitches of interconnections, etc.

As the information society is advanced, the semiconductor devices are required to be further micronized and to be higher integrated.

In semiconductor devices, such as SRAMs, FLASH memories, etc., the interconnections and the conductor plugs are arranged in extremely high densities in the memory cell region. The interconnections, the conductor plugs, etc. are arranged in extremely high densities, whereby the memory cells can have the sizes reduced, and resultantly the memory capacities can be increased.

Following references disclose the background art of the present invention.

[Patent Reference 1]
Specification of Japanese Patent Application Unexamined Publication No. 2003-174105

[Patent Reference 2]
Specification of Japanese Patent Application Unexamined Publication No. 2003-258090

[Patent Reference 3]
Specification Of Japanese Patent Application Unexamined Publication No. 2003-124249

[Patent Reference 4]
Specification of Japanese Patent Application Unexamined Publication No. 2002-76048

However, interconnections and conductor plugs which are arranged in extremely high densities tend to easily short circuit with each other. The short circuits with adjacent interconnections and conductor plugs lead to lower fabrication yields of semiconductor devices. FIG. 31 is a plan view of adjacent interconnections which are short circuited with each other. As illustrated in FIG. 31, the interconnections 164 are arranged at an extremely narrow pitch. As indicated by the dot-line circle, conductor plugs 162 are buried below the interconnections 164, formed integral with the interconnections 164. The interconnections 164 and the conductor plugs 162 are buried in an insulation layer 152 by dual damascene. The solid line circle indicates the short circuit between the adjacent interconnections 164.

The use of ArF exposure systems and half-tone phase shift masks can allow larger margins in the exposing process, whereby the short circuit between the interconnections can be prevented, and the interconnection pitch can be small. However, the ArF exposure systems and half-tone phase shift masks are so expensive that they cannot meet the requirement of cost reduction of semiconductor devices.

SUMMARY OF THE INVENTION

An object of the present invention is to provide a semiconductor device which permits pitches between interconnections, etc. to be small without using expensive exposure systems and expensive masks, and a method for fabricating the semiconductor device.

According to one aspect of the present invention, there is provided a semiconductor device comprising: a first conductive pattern; a second conductive pattern formed adjacent to the first conductive pattern and being in substantially parallel with the first conductive pattern; a first conductor plug formed below a prescribed region of the first conductive pattern and connected to the first conductive pattern; a second conductor plug formed over the prescribed region of the first conductive pattern and connected to the first conductive pattern; a third conductor plug formed below a prescribed region of the second conductive pattern and connected to the second conductive pattern, the prescribed region of the second conductive pattern being adjacent to the prescribed region of the first conductive pattern; a fourth conductor plug formed over the prescribed region of the second conductive pattern and connected to the second conductive pattern; a third conductive pattern formed above the first conductive pattern and connected to the second conductor plug; and a fourth conductive pattern formed above the second conductive pattern and connected to the fourth conductor plug, the fourth conductor plug being arranged at a position which is offset from the second conductor plug.

According to another aspect of the present invention, there is provided a semiconductor device comprising: a first conductive pattern; a second conductive pattern formed adjacent to the first conductive pattern and being substantially parallel with the first conductive pattern; a first conductor plug formed below a prescribed region of the first conductive pattern and connected to the first conductive pattern; a second conductor plug formed over the prescribed region of the first conductive pattern and connected to the first conductive pattern; a third conductor plug formed below a prescribed region of the second conductive pattern and connected to the second conductive pattern, the prescribed region of the second conductive pattern being adjacent to the prescribed region of the first conductive pattern; a fourth conductor plug formed over the prescribed region of the second conductive pattern and connected to the second conductive pattern; a third conductive pattern formed above the first conductive pattern and connected to the second conductor plug; and a fourth conductive pattern formed above the second conductive pattern and connected to the fourth conductor plug, the third conductor plug being arranged at a position which is offset from the first conductor plug, the second conductor plug being positioned in a region above a region where the first conductor plug is formed, and the fourth conductor plug being positioned in a region above a region where the third conductor plug is formed.

According to the present invention, the conductor plugs are offset from each other in the longitudinal direction of the interconnections, whereby the parts of the interconnections having an increased width can be distanced from each other. Thus, according to the present invention, the interconnections can be arranged at a small pitch without using an ArF exposure system and a half tone phase shift mask, which are expensive. Accordingly, the semiconductor device according to the present invention can have high integration and low costs while ensuring high fabrication yields.

BRIEF DESCRIPTION OF THE DRAWINGS

FIG. 19 is a view of the semiconductor device according to the first embodiment of the present invention in the steps of the method for fabricating the semiconductor device, which illustrate the method (Part 13).

DETAILED DESCRIPTION OF THE INVENTION

A First Embodiment

The semiconductor device according to a first embodiment of the present invention and the method for fabricating the semiconductor device will be explained with reference to FIGS. 1A to 20.

(The Semiconductor Device)

Figure 1A:
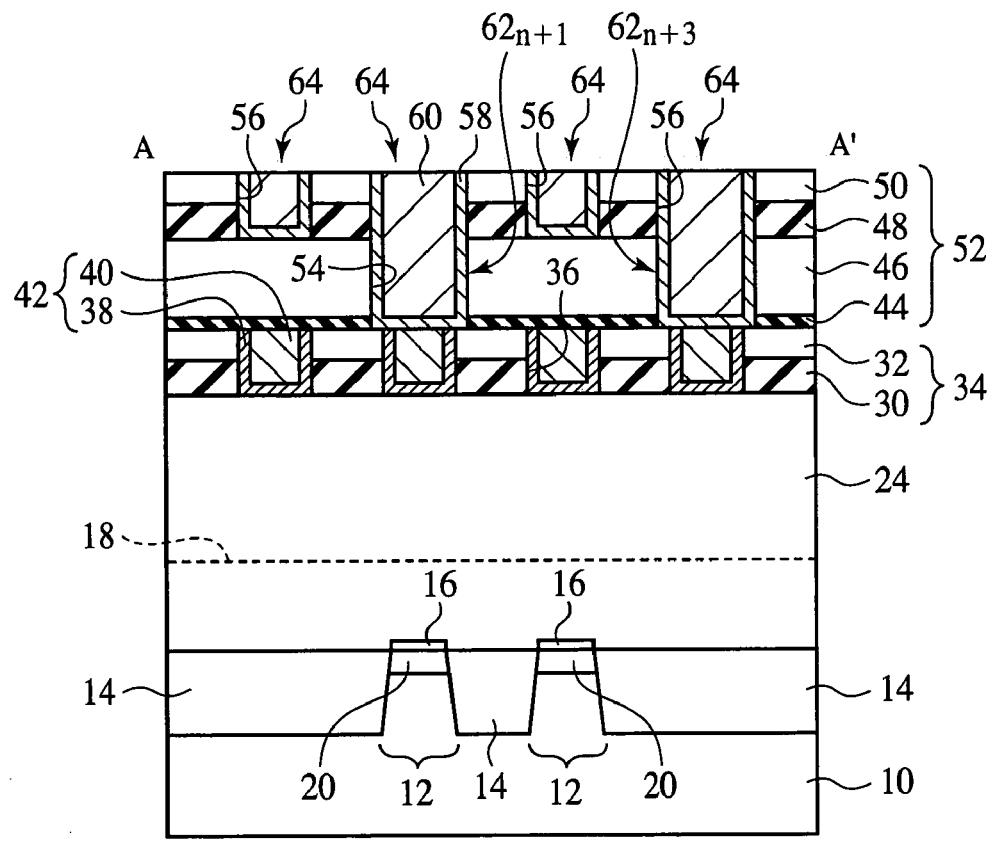
FIGS. 1A and 1B are a sectional view and a plan view of the semiconductor device according to a first embodiment of the present invention.
Figure 1B:
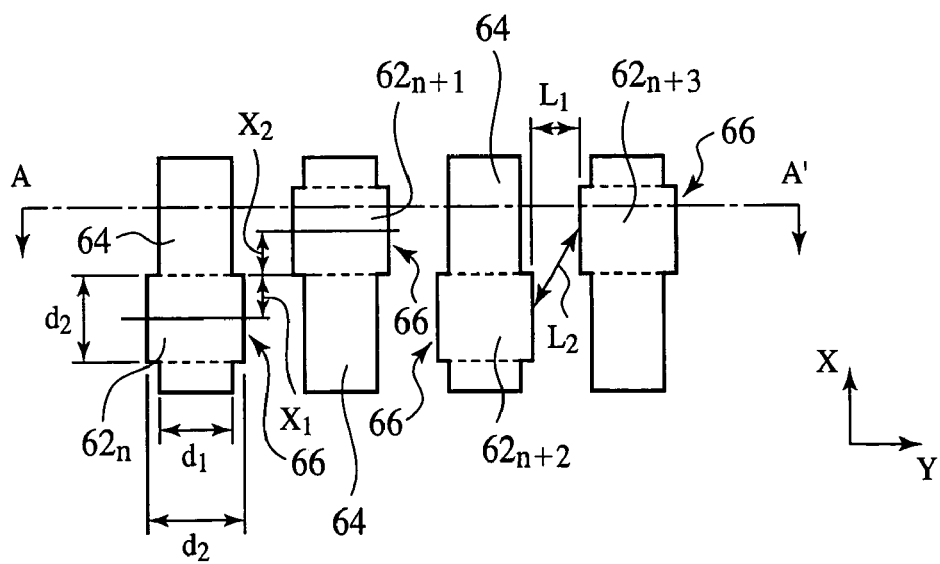
Figure 2:
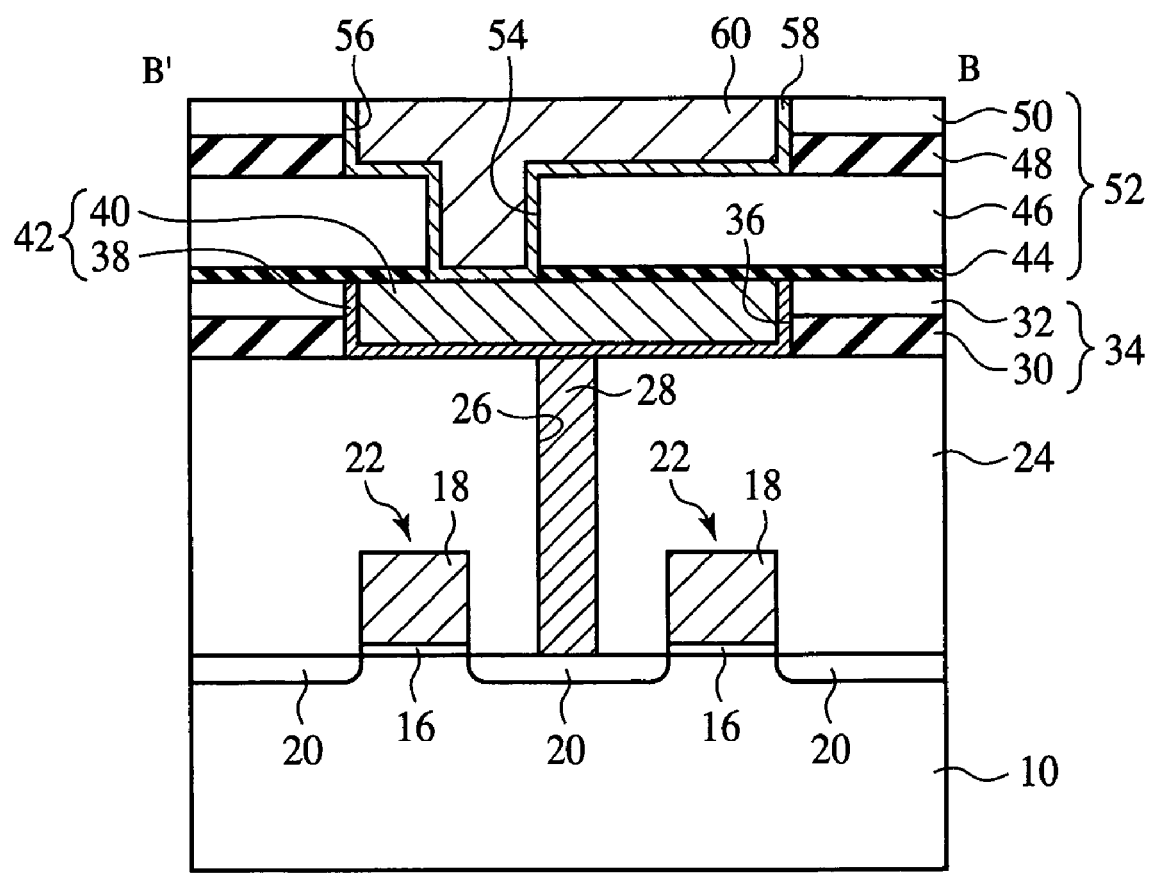
FIG. 2 is a sectional view of the semiconductor device according to the first embodiment of the present invention.
Figure 3:
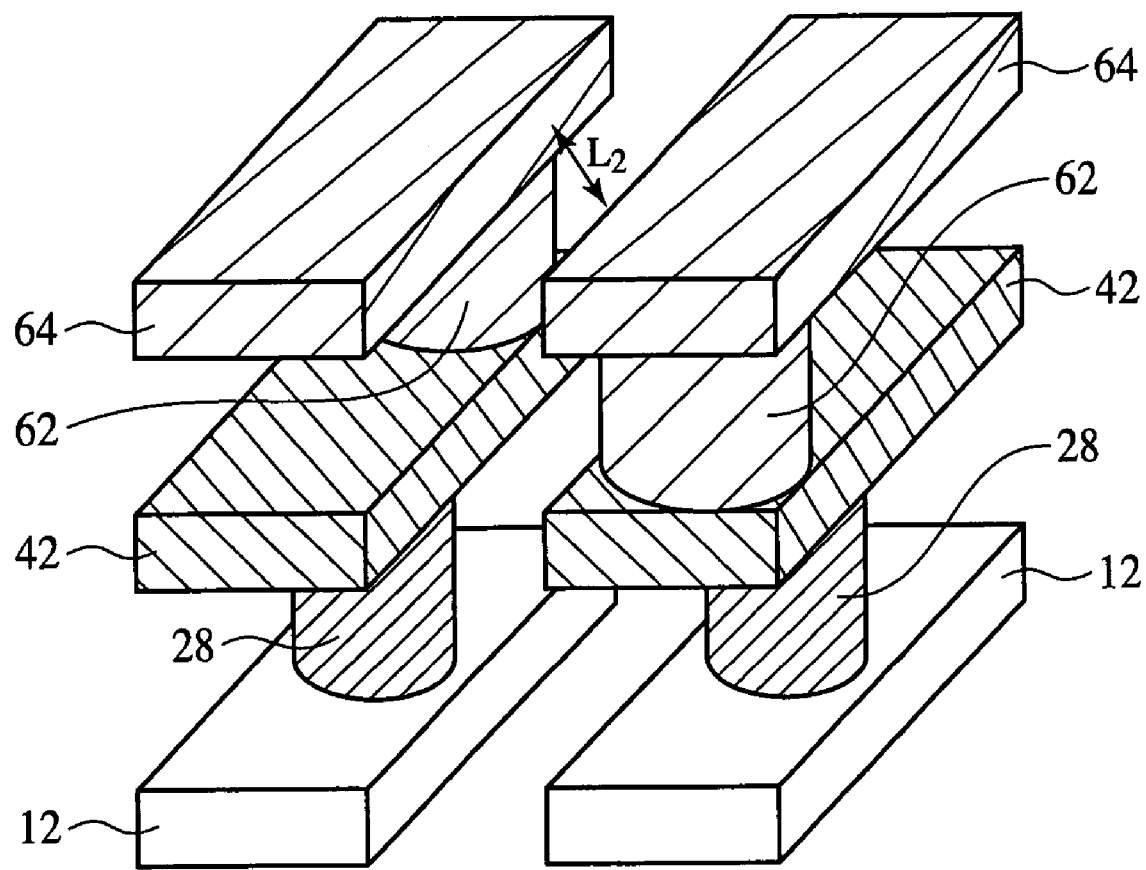
FIG. 3 is a perspective view of a part of the semiconductor device according to the first embodiment of the present invention.
Figure 4:
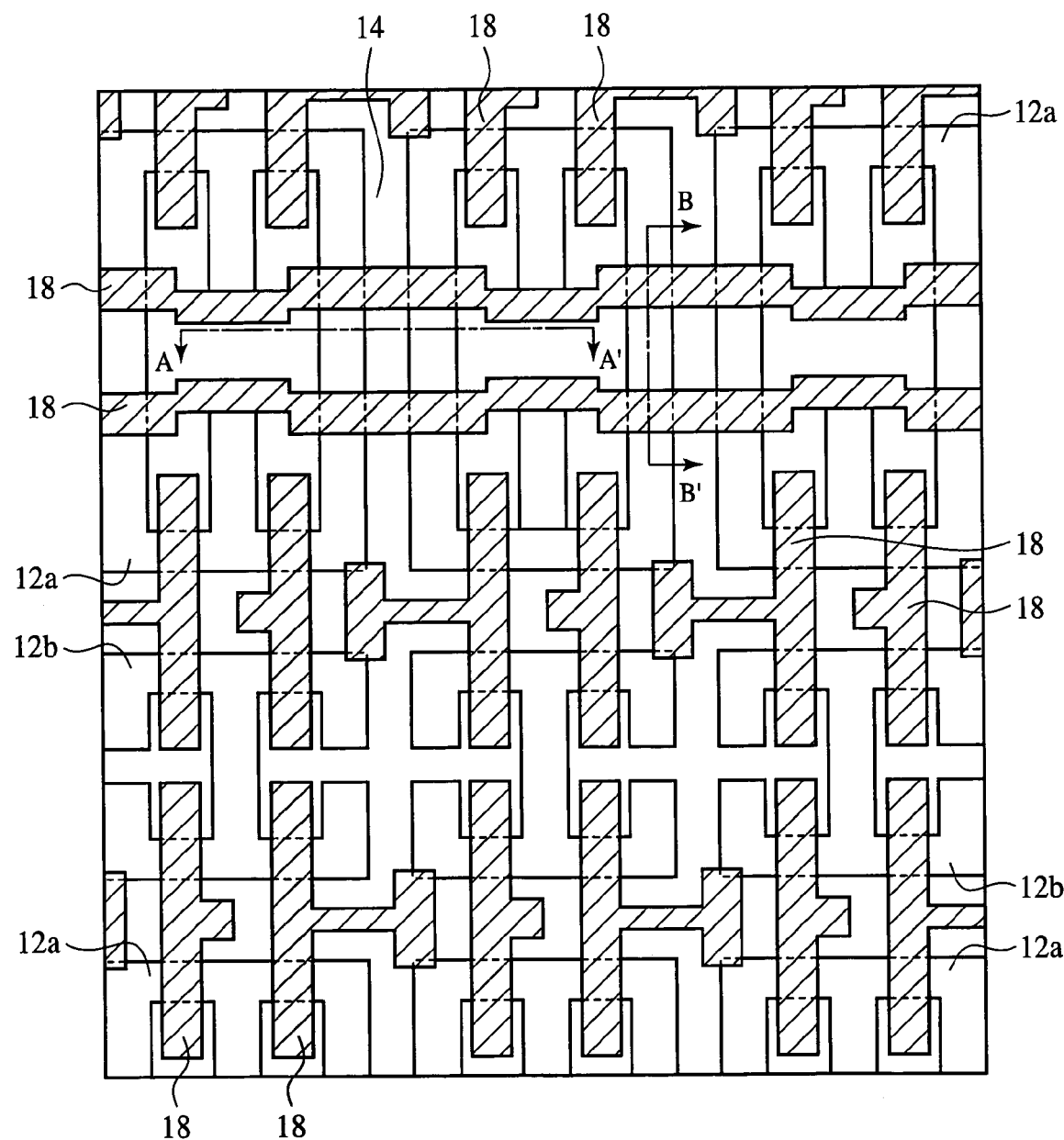
FIG. 4 is a plan view of the semiconductor device according to the first embodiment of the present invention (Part 1).
Figure 5:
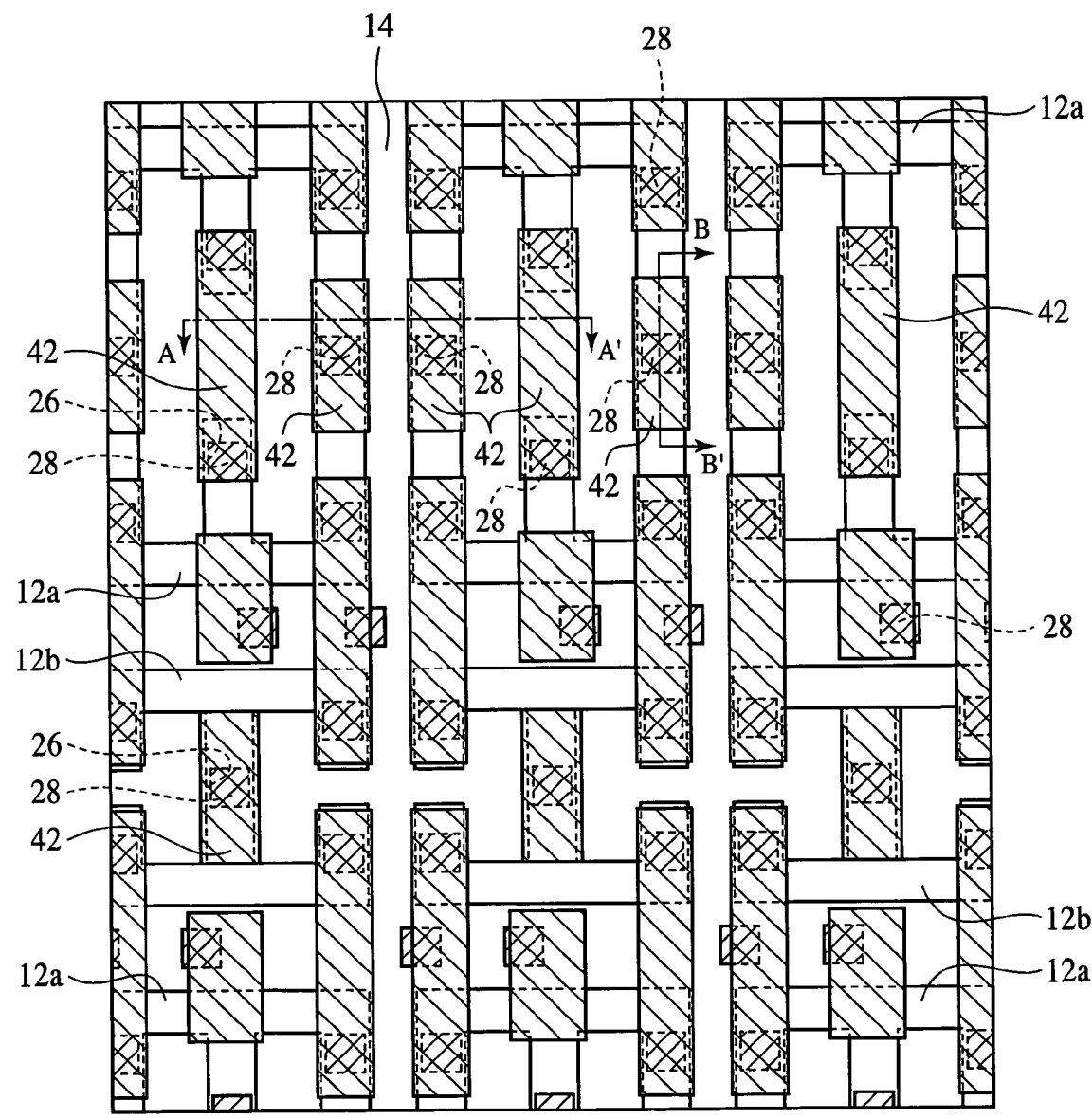
FIG. 5 is a plan view of the semiconductor device according to the first embodiment of the present invention (Part 2).
Figure 6:
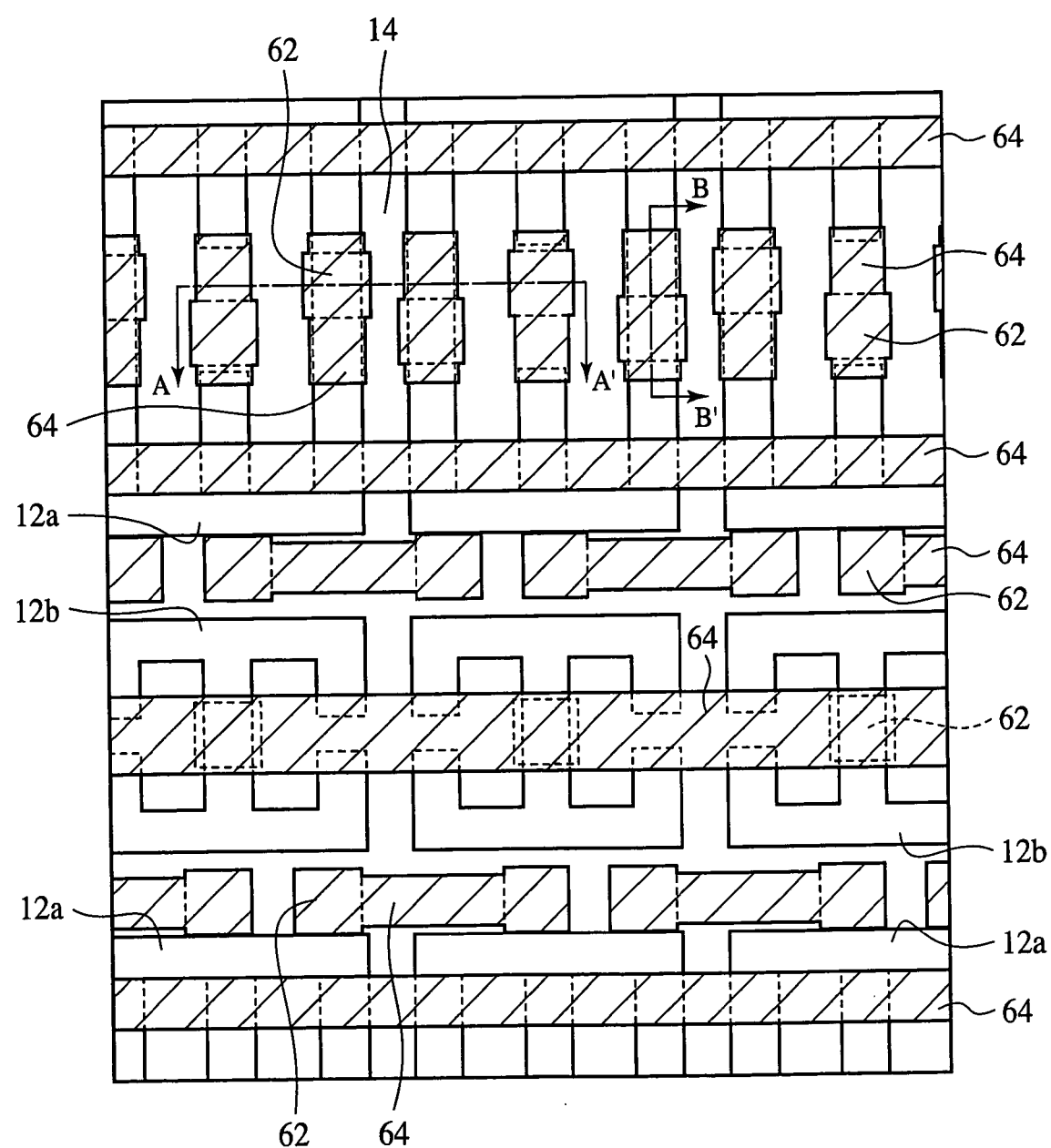
FIG. 6 is a plan view of the semiconductor device according to the first embodiment of the present invention (Part 3).

First, the semiconductor device according to the present embodiment will be explained with reference to FIGS. 1A to 6. FIGS. 1A and 1B are a sectional view and a plan view of the semiconductor device according to the present embodiment. FIG. 1A is the sectional view, and FIG. 1B is the plan view. FIG. 1A is the sectional view along the line A—A in FIG. 1B. FIG. 2 is a sectional view of the semiconductor device according to the present embodiment. FIG. 2 is the sectional view along the line B–B' in FIGS. 4 to 6. FIG. 3 is a perspective view of a part of the semiconductor device according to the present embodiment. FIGS. 4 to 6 are plan views of the semiconductor device according to the present embodiment. FIG. 4 illustrates mainly a layout of device regions 12, device isolation regions 14 and gate electrodes 18. FIG. 5 illustrates mainly a layout of conductor plugs 28 and first metal interconnection layers 42. FIGS. 6 illustrates mainly a layout of conductor plugs 62 and second metal interconnection layers 64.

In the present embodiment, the present invention is applied to an SRAM. However, the principle of the present invention is applicable not only to SRAMs but also any other semiconductor device.

As illustrated in FIGS. 1A and 1B, device isolation regions 14 for defining device regions 12 are formed on a semiconductor substrate 10 of, e.g., silicon. N-channel transistors are formed in the device regions 12a (see FIG. 4), and p-channel transistors are formed in the device regions 12b (see FIG. 4).

As illustrated in FIG. 2, gate electrodes 18 are formed on the semiconductor substrate 10 with a gate insulation film 16 formed therebetween. The gate electrodes 18 are formed, crossing the device regions 12 (see FIG. 4). The gate electrodes 18 are formed of, e.g., polysilicon.

A source/drain diffused layer 20 is formed in the device regions 12 on both sides of each gate electrode 18.

Thus, transistors 22 each including the gate electrode 18 and the source/drain diffused layer 20 are constituted.

An inter-layer insulation film 24 of, e.g., a silicon oxide film is formed on the semiconductor substrate 10 with the transistors 22 formed on.

Contact holes 26 are formed in the inter-layer insulation film 24 down to the gate electrodes 18 or the source/drain diffused layer 20 of the transistor 22.

Contact plugs 28 of, e.g., tungsten are buried in the contact holes 26.

An organic insulation film 30 and a silicon oxide film 32 are sequentially formed on the inter-layer insulation film 24 with the conductor plugs 28 buried in. The organic insulation film 30 and the silicon oxide film 32 form a layer film 34.

Trenches 36 are formed in the organic insulation film 30 and the silicon oxide film 32.

A barrier metal film 38 of, e.g. TiN is formed on the inside surface of the trenches 36. A Cu (copper) film 40, for example, is formed in the trenches 36 with the barrier metal film 38 formed in. The barrier metal film 38 and the Cu film 40 form an interconnection 42. The interconnection 42 constitutes a first metal interconnection layer.

A silicon nitride film 44, a silicon oxide film 46, an organic insulation film 48 and a silicon oxide film 50 are sequentially formed on the layer film 34 with the interconnection 42 buried in. The silicon nitride film 44, the silicon oxide film 46, the organic insulation film 48 and the silicon oxide film 50 form a layer film 52.

Contact holes 54 are formed in the layer film 52 down to the interconnection 42. Trenches 56 are formed in the organic insulation film 48 and the silicon oxide film 50 down to the silicon oxide film 46. Each trench 56 are connected with each contact hole 54.

A barrier metal film 58 of, e.g., TiN is formed on the inside surface of the trenches 56 and the contact holes 54. A Cu film 60 is buried in the trenches 56 and the contact holes 54 with the barrier metal film 58 formed in. That of the barrier metal film 56 and the Cu film 60 buried in the contact holes 54 constitute conductor plugs 62. A part of the barrier metal 56 and the Cu film 60 buried in the trenches 56 constitute an interconnection 64. The conductor plug 62 and the interconnection 64 are formed integral with each other. The interconnection 64 constitutes a second metal interconnection layer.

As illustrated in FIG. 1B, the interconnection 64 is arranged substantially perpendicular (Y direction) to the longitudinal direction of the interconnection 64.

The conductor plugs 62 are offset alternately in the longitudinal direction (X direction) of the interconnections 64. In other words, the conductor plug $62_{n+1}$ is offset from the conductor plug $62_n$ in the longitudinal direction of the interconnection 64. The conductor plug $62_{n+2}$ is offset from the conductor plug $62_{n+1}$ in the direction opposite to the direction in which the conductor plug $62_{n+1}$ is offset. The conductor plug $62_{n+3}$ is offset from the conductor plug $62_{n+2}$ in the direction opposite to the direction in which the conductor plug $62_{n+2}$ is offset. In the present embodiment, the conductor plugs 62 are offset from each other alternately in X direction for the following reason.

That is, when the patterns of the contact holes 54 and the patterns of the trenches 56 are exposed, the diameter $d_2$ of the contact holes 54 are set larger than the width $d_1$ of the trenches 56, because due to the diffracted light in the exposure it is more difficult to form the micronized contact holes without failure than to form the micronized trenches 56. Accordingly, when the interconnections 64 and the conductor plugs 62 are formed integral with each other by dual damascene, the interconnections 64 have a locally increased width at the parts 66 which are above the conductor plugs 62. Accordingly, when the conductor plugs 62 are simply arranged, the distance $L_1$ between the parts 66 where the interconnections 64 have an increased width becomes extremely small. Furthermore, as will be described later, the selectivity ratio between the silicon nitride film 72 and the silicon oxide film 50 is not always sufficiently high, and when the silicon oxide film 50 and the silicon oxide film 46 are etched with the silicon nitride film 72 and the organic insulation film 48 as the mask (see FIGS. 15A and 15B), the edge of the silicon oxide film 50 is etched, and the width of the trenches 56 is increased at the upper parts (see FIG. 32). The extremely decreased distance $L_1$ between the parts 66 of the interconnections 64 having the width locally increased, and the increasingly tapered upper parts of the trenches 56 cause the adjacent interconnections 64 to short circuit with each other.

The use of an ArF exposure system and a half tone phase shift mask allows margins for the exposure, and accordingly, the short circuit can be prevented while the interconnection pitch can be small.

However, ArF exposure systems and half tone phase shift masks are extremely expensive. In order to lower costs of semiconductor devices, it is preferable to use KrF exposure systems and a mask except a half tone mask, which are relatively inexpensive.

In the semiconductor device according to the present embodiment, the conductor plugs 62 are alternately offset in the longitudinal direction of the interconnections 64 (X direction), whereby the distance $L_2$ between the wider parts 66 of the interconnections 64 can be made large. Thus, according to the present embodiment, even when a KrF exposure system and the mask except the half tone mask are used, the semiconductor device having a small interconnection pitch can be fabricated at high yields.

From the viewpoint of preventing the short circuit between the adjacent interconnections 64, it is preferable that the distance $X_1+X_2$ at which the conductor plugs 62 are offset from each other in X direction is larger, but the distance is preferably with a range which does not induce size increases of the memory cell. The distances $X_1$, $X_2$ at which the conductor plugs 62 are offset in X direction are respectively distances from positions as references, which are preferably a half length ($d_2/2$) of, e.g., the diameter $d_2$ of the contact holes 54. In this case, the parts of the interconnections 64, where the width of the interconnections 64 is locally increased are offset from each other by the diameter $d_2$ of the conductor plugs 62 in the longitudinal direction (X direction) of the interconnections 64.

The distance $X_1+X_2$ at which the conductor plugs 62 are offset from each other in X direction is not essentially as described above but can be suitably set.

Thus, the semiconductor device according to the present embodiment is constituted.

The semiconductor device according to the present embodiment is characterized mainly in that the conductor plugs 62 are alternately offset from each other in the longitudinal direction (X direction) of the interconnections 64.

According to the present embodiment, the conductor plugs 62 are offset alternately from each other in the longitudinal direction (X direction) of the interconnections 64, whereby the parts 66 of the interconnections 64 having the width increased can be distanced from each other. Thus, according to the present embodiment, the pitch of the interconnections 64 can be small without using an expensive ArF exposure system and a half tone phase shift mask. According to the present embodiment, the semiconductor device of high integration can be provided at low costs while the fabrication yield can be retained high.

(The Method for Fabricating the Semiconductor Device)

Next, the method for fabricating the semiconductor device according to the present embodiment will be explained with reference to FIGS. 7A to 20. FIGS. 7A to 20 are sectional views of the semiconductor device according to the present embodiment in the steps of the method for fabricating the semiconductor device, which explain the method. FIGS. 7A to 9B are the sectional views. FIG. 10A, 11A, 12A, 13A, 14A, 15A, 16A, 17A are sectional views. FIGS. 10B, 11B, 12B, 13B, 14B, 15B, 16B, 17B are plan views respectively corresponding to FIGS. 10A, 11A, 12A, 13A, 14A, 15A, 16A, 17A. FIGS. 18A to 20 are the sectional views.

Figure 7A:
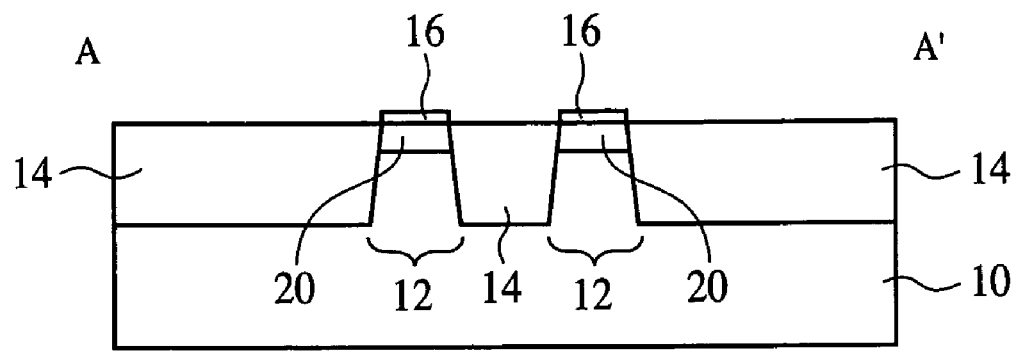
FIGS. 7A and 7B are views of the semiconductor device according to the first embodiment of the present invention in the steps of the method for fabricating the semiconductor device, which illustrate the method (Part 1).

First, as illustrated in FIG. 7A, the device isolation regions 14 are formed by, e.g., STI (Shallow Trench Isolation) to defined the device regions 12 in the semiconductor substrate 10.

Next, the gate insulation film.16 is formed on the surface of the device regions 12 by, e.g., thermal oxidation.

Next, a polysilicon film is formed on the entire surface by, e.g., CVD. The polysilicon film is to be the gate electrodes 18.

Then, a photo resist film (not shown) is formed on the entire surface by, e.g., spin coating. The photoresist film can be, e.g., a positive ArF excimer resist.

Then, the patterns are exposed in the photoresist film by using a reticle. The mask (reticle) is a half tone phase shift mask. The photoresist film is exposed with an exposure system using an ArF excimer laser as the light source. Thus, the patterns are exposed in the photoresist film. Then, the photoresist film is developed.

Then, with the photoresist film as the mask, the polysilicon film is patterned. Thus, the gate electrodes 18 (see FIG. 2) of polysilicon are formed.

Next, with the gate interconnections 18 as the mask, a dopant impurity is implanted in the semiconductor substrate 10 on both sides of each gate electrode 18 by, e.g., ion implantation. The source/drain diffused layer 20 (see FIG. 2) is formed in the semiconductor substrate 10 on both sides of each gate electrode 18. Thus, the transistors 22 (see FIG. 2) each including the gate electrode 18 and the source/drain diffused layer 20 are formed.

Figure 7B:
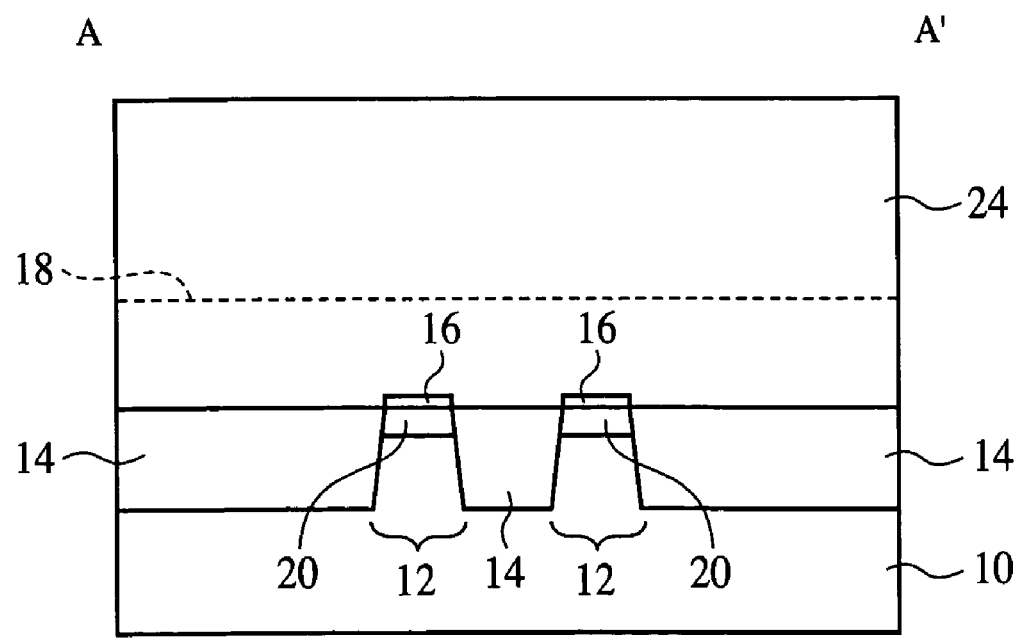

Next, as illustrated in FIG. 7B, the inter-layer insulation film 24 of a 200 nm-thickness silicon oxide film is formed on the entire surface by, e.g., plasma-enhanced CVD.

Then, the surface of the inter-layer insulation film 24 is polished by, e.g., CMP. The surface of the inter-layer insulation film 24 is thus planarized.

Figure 8A:
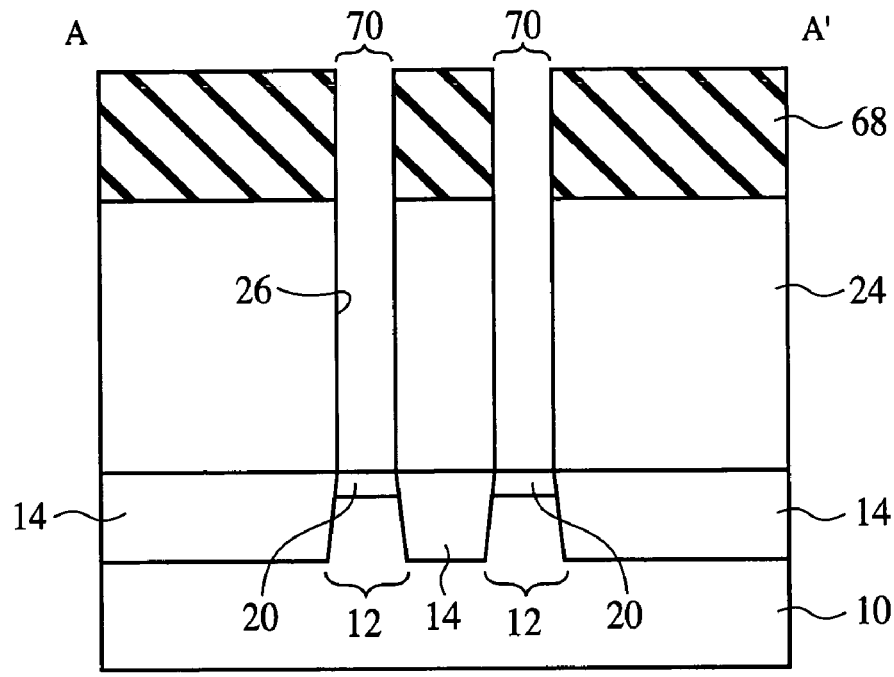
FIGS. 8A and 8B are views of the semiconductor device according to the first embodiment of the present invention in the steps of the method for fabricating the semiconductor device, which illustrate the method (Part 2).
Figure 8B:
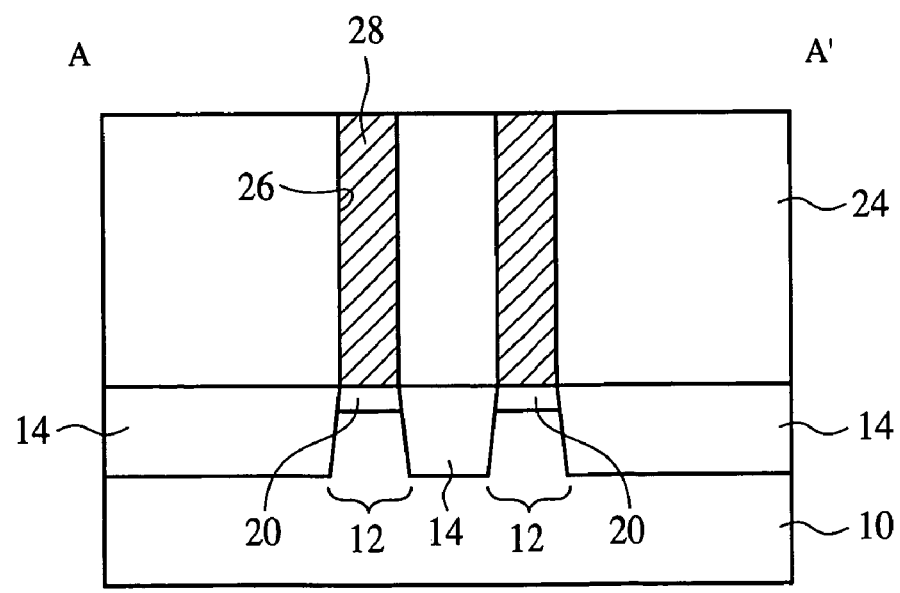

Next, as illustrated in FIG. 8A, a photoresist film 68 is formed on the entire surface by, e.g., spin coating. The photoresist film 68 is, e.g., positive ArF excimer resist.

Then, using a reticle (not shown), the patterns are exposed in the photoresist film 68. The reticle is a half tone phase shift mask for the ArF excier laser lithography. An ArF excimer laser is used in exposing photoresist films. The patterns are thus exposed in the photoresist film 68. Then, the photoresist film 68 is developed. Thus, openings 70 for forming the contact holes 26 are formed in the photoresist film 68. Then, the photoresist film 68 is released.

Then, with the photoresist film 68 as the mask, the inter-layer insulation film 24 is etched. Thus, the contact holes 26 are formed in the inter-layer insulation film 24 down to the gate electrodes 18 or the source/drain diffused layer 20 of the transistor 22.

Then, a 10 nm-thickness Ti film and a 50 nm-thickness TiN film are sequentially formed by, e.g., sputtering. Thus, the barrier metal film (not shown) of the Ti film and the TiN film is formed.

Next, a 200 nm-thickness tungsten film (not shown) is formed by, e.g., CVD.

Then, the tungsten film and the barrier metal film are polished by, e.g., CMP until the surface of the inter-layer insulation film 24 is exposed. Thus, the conductor plugs 28 of the tungsten film and the barrier metal film are buried in the contact holes 26 (see FIGS. 8A and 8B).

Figure 9A:
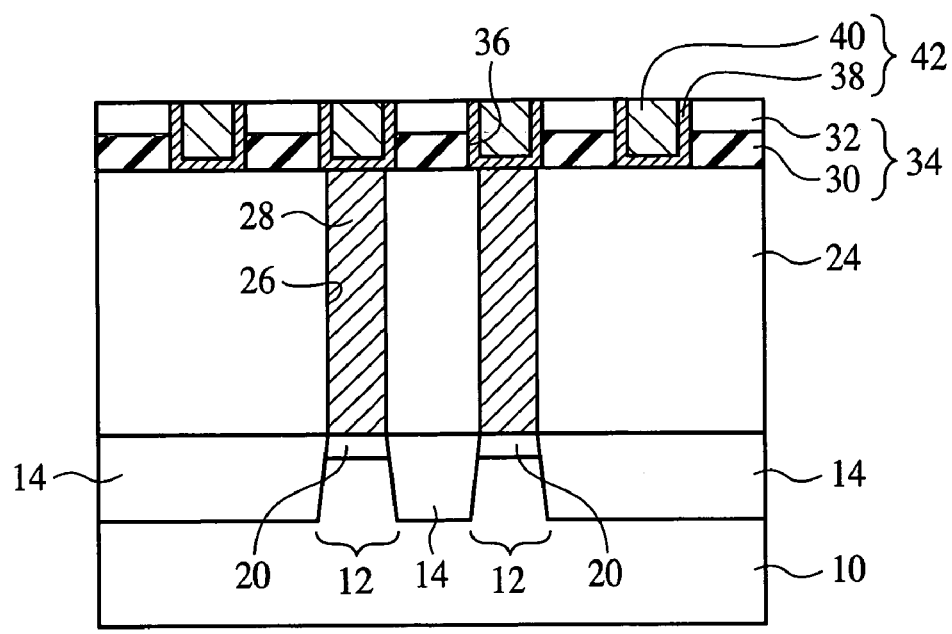
FIGS. 9A and 9B are views of the semiconductor device according to the first embodiment of the present invention in the steps of the method for fabricating the semiconductor device, which illustrate the method (Part 3).

Next, as illustrated in FIG. 9A, the organic insulation film 30 is formed in a 400 nm-thickness by, e.g., spin coating. The material of the organic insulation film 30 is, e.g., an organic insulation material by Allied Signal, Inc. (Trade name: FLARE 2.0). FLARE 2.0 is a dielectric material having a dielectric constant lower than silicon oxide film. The dielectric constant of FLARE 2.0 is about 2.8, and the dielectric constant of silicon oxide film is about 4.1. The organic insulation film 30 having such low dielectric constant is for decreasing the parasitic capacitance between the interconnections. In the present embodiment, FLARE 2.0 is used as the material of the organic insulation film 30, but the material of the organic insulation film 30 is not essentially FLARE 2.0. For example, an organic dielectric material by Dow Chemical Company (Trade name; SiLK) or others may be used as the material of the organic insulation film 30. Other hydrocarbon content resins, fluorine content resins, silicon oxycarbide or others may be used as the material of the organic insulation film 30.

Next, the silicon oxide film 32 is formed in a 100 nm-thickness by plasma-enhanced CVD. The organic insulation film 30 and the silicon oxide film 32 form the layer film 34.

Next, a photo resist film (not shown) is formed on the entire surface by, e.g., spin coating. The photoresist film is, e.g., a positive type KrF excimer resist.

Next, by using a reticle (not shown), the photoresist film is exposed. The reticle is not of the half tone type but the general type. The photoresist film is exposed by a KrF excimer laser. Then, the photoresist film s developed. Thus, openings (not shown) are formed in the photoresist film. The openings are for forming the trenches 36 in the layer film 34.

Then, with the photoresist film as the mask, the trenches 36 are formed in the layer film 34 down to the inter-layer insulation film 24 and the conductor plugs 28. The trenches 36 are for the interconnections 42 to be buried in.

Next, the barrier metal film 38 is formed of a 50 nm-thickness TiN film by, e.g., sputtering.

Then, the Cu film 40 is formed in a 800 nm-thickness is formed by, e.g., sputtering.

Next, the Cu film 40 and the barrier metal film 38 are polished by, e.g., CMP until the surface of the layer film 34 is exposed. The interconnections 42 of the barrier film 38 and the Cu film 40 are buried in the trenches 36.

Figure 9B:
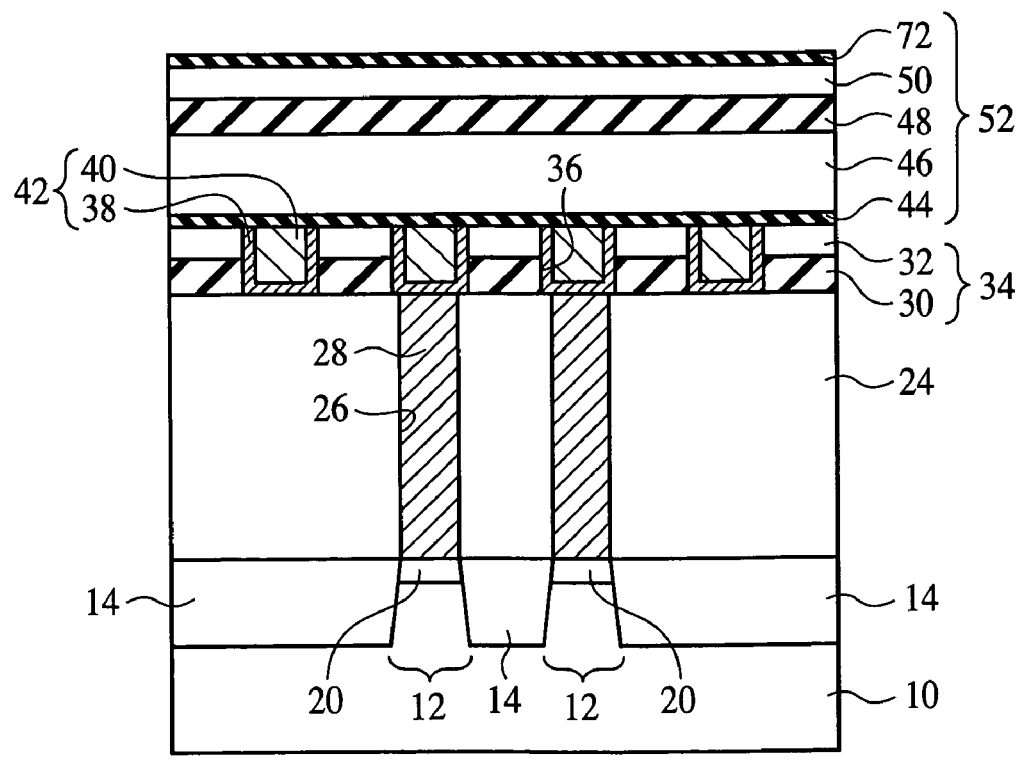

Next, as illustrated in FIG. 9B, the silicon nitride film 44 is formed on the entire surface in a 50 nm-thickness by, e.g., plasma-enhanced CVD.

Next, the silicon oxide film 46 is formed on the entire surface in a 600 nm-thickness by, e.g., plasma-enhanced CVD.

Then, the organic insulation film 48 is formed on the entire surface in a 400 nm-thickness by, e.g., spin coating. The material of the organic insulation film 48 is the same as, e.g., the material of the organic insulation film 30 described above.

Next, the silicon oxide film 50 is formed on the entire surface in a 100 nm-thickness by, e.g., plasma-enhanced CVD.

Then, the silicon nitride film 72 is formed on the entire surface in a 100 nm-thickness by, e.g., plasma-enhanced CVD. The silicon nitride film 44, the silicon oxide film 46, the organic insulation film 48, the silicon oxide film 50 and the silicon nitride film 72 constitute the layer film 52.

Figure 10A:
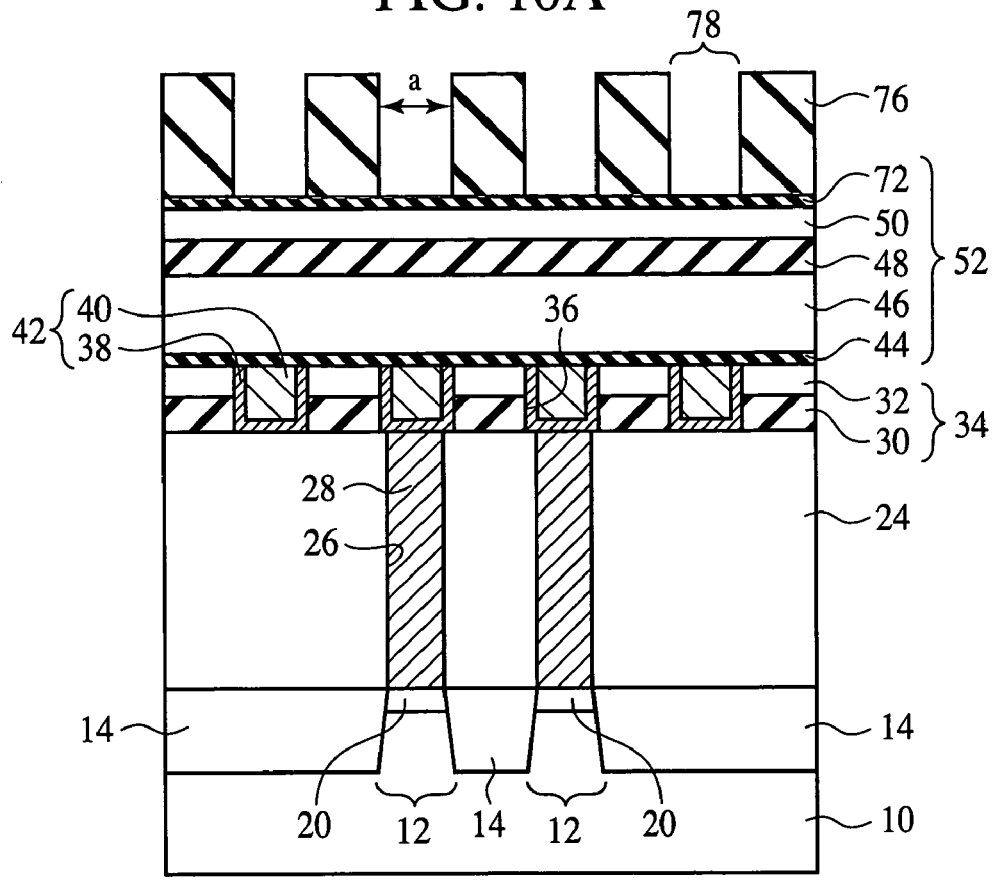
FIGS. 10A and 10B are views of the semiconductor device according to the first embodiment of the present invention in the steps of the method for fabricating the semiconductor device, which illustrate the method (Part 4).
Figure 10B:
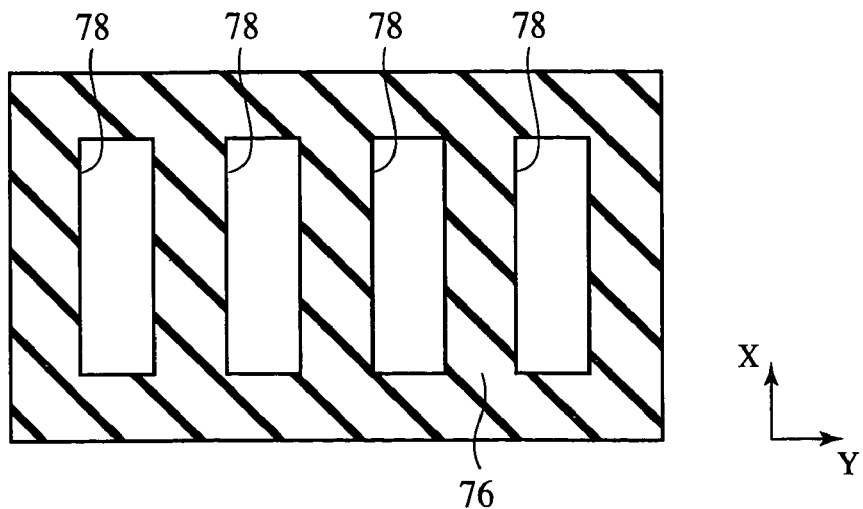

Next, as illustrated in FIGS. 10A and 10B. the photoresist film 76 is formed on the entire surface by, e.g., spin coating. The photoresist film 76 is, e.g., a positive KrF excimer resist.

Then, by using a reticle (not shown), the photoresist film 76 is exposed. The reticle is not of the half tone type but the general type. The photoresist film 76 is exposed by a KrF excimer laser. Then, the photoresist film 76 is developed. Thus, the openings 78 are formed in the photoresist film 76. The openings 78 are for forming the openings 80 in the silicon nitride film 72. The width a of the openings 78 is, e.g., about 0.18–0.22 µm, because generally about 0.18–0.22 µm is the limit of the micronization in exposing interconnection patterns with KrF excimer lasers.

Figure 11A:
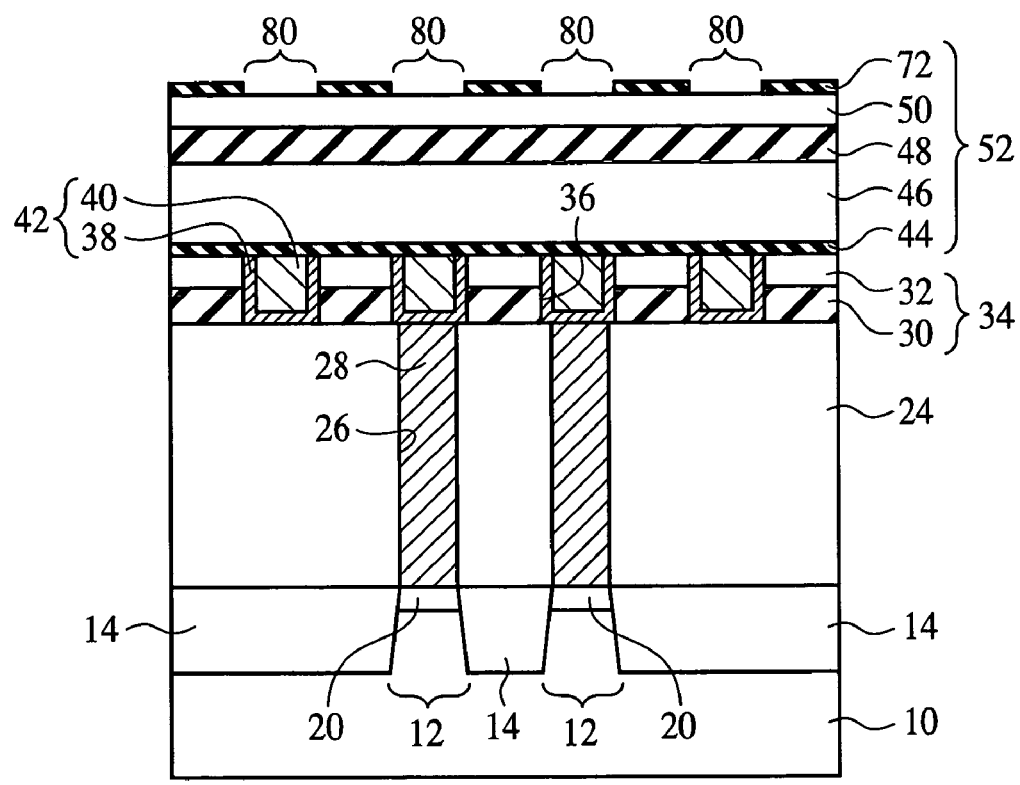
FIGS. 11A and 11B are views of the semiconductor device according to the first embodiment of the present invention in the steps of the method for fabricating the semiconductor device, which illustrate the method (Part 5).
Figure 11B:
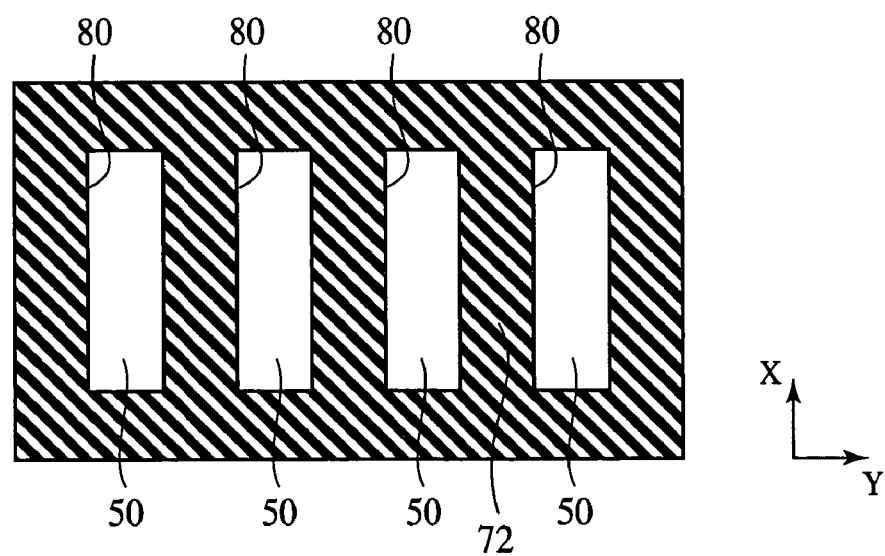

Next, as illustrated in FIGS. 11A and 11B, with the photoresist film 76 as the mask and the silicon oxide film 50 as the etching stopper, the silicon nitride film 72 is etched. Thus, the openings 80 are formed in the silicon nitride film 72. The openings 80 are for forming the trenches 56 in the layer film 52. Then, the photoresist film 76 is released.

Figure 12A:
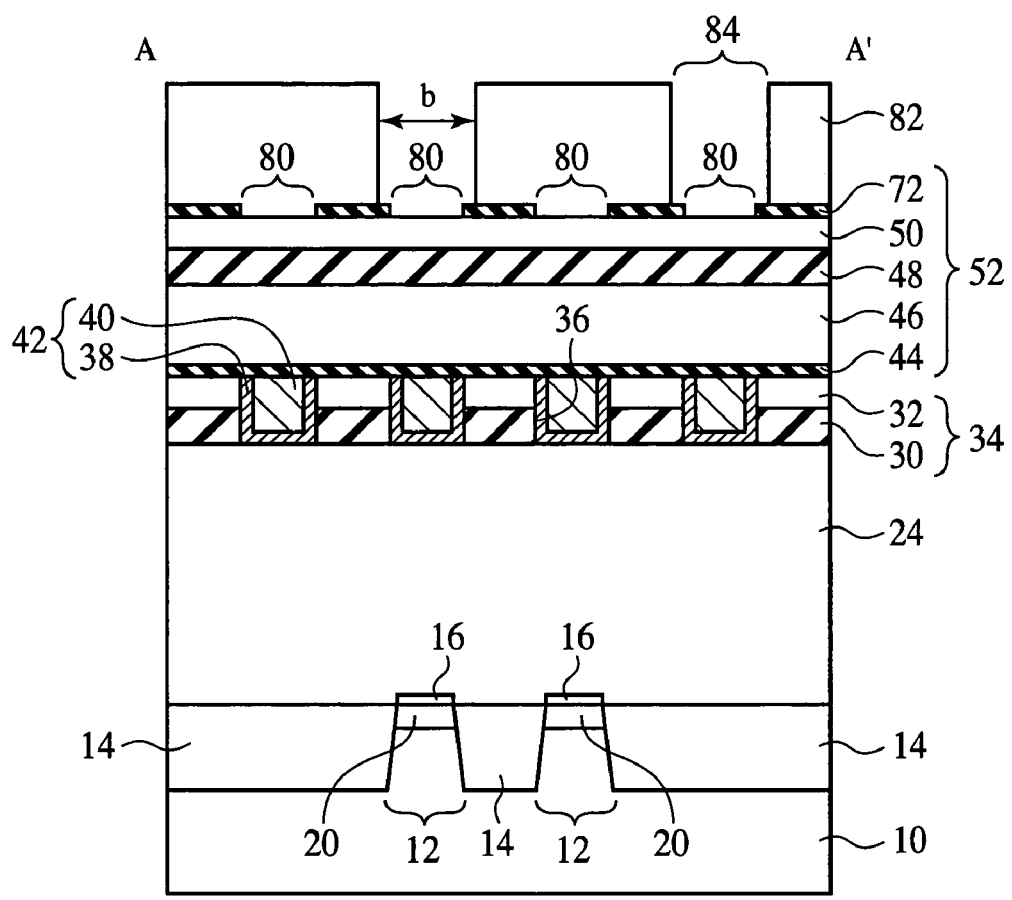
FIGS. 12A and 12B are views of the semiconductor device according to the first embodiment of the present invention in the steps of the method for fabricating the semiconductor device, which illustrate the method (Part 6).
Figure 12B:
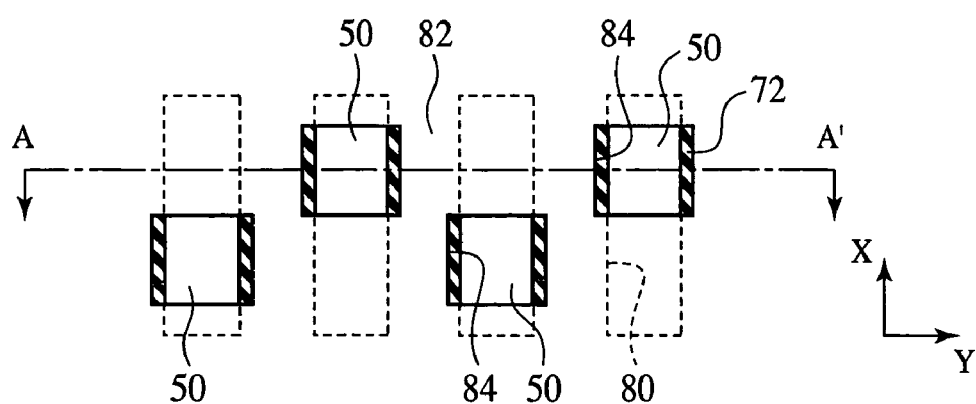

Then, as illustrated in FIGS. 12A and 12B, the photoresist film 82 is formed on the entire surface by, e.g., spin coating. The photoresist film 82 is, e.g., a positive type KrF excimer resist.

Next, by using a reticle (not shown), the photoresist film 82 is exposed. The reticle is not of the half tone type but the general type. The photoresist film 82 is exposed by a KrF excimer laser. Then, the photoresist film 82 is developed. Thus, the openings 84 are formed in the photoresist film 82. The openings 84 are for forming the openings 86 (see FIGS. 13A and 13B) in the silicon nitride film 72 and the silicon oxide film 50. The diameter b of the openings 84 is, e.g., about 0.20–0.24 µm. The diameter b of the openings 84 for forming the opening 86 is set larger than the width a of the openings 78 for forming the trenches 56 because the margin of the processing for forming contact holes is smaller than the margin of the processing for forming trenches, in the exposure technology. The limit of the micronization for exposing the patterns of the contact holes 54 with a KrF excimer laser is generally about 0.20–0.24 µm.

Figure 13A:
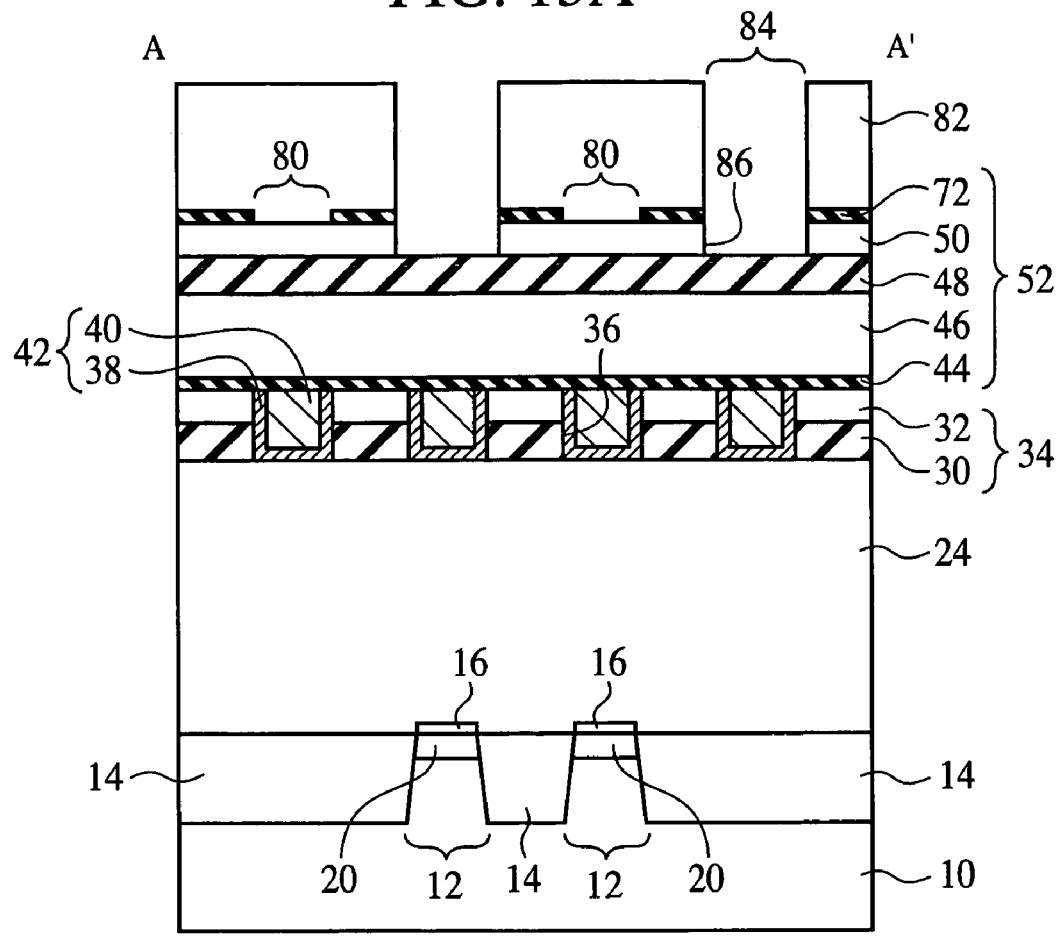
FIGS. 13A and 13B are views of the semiconductor device according to the first embodiment of the present invention in the steps of the method for fabricating the semiconductor device, which illustrate the method (Part 7).
Figure 13B:
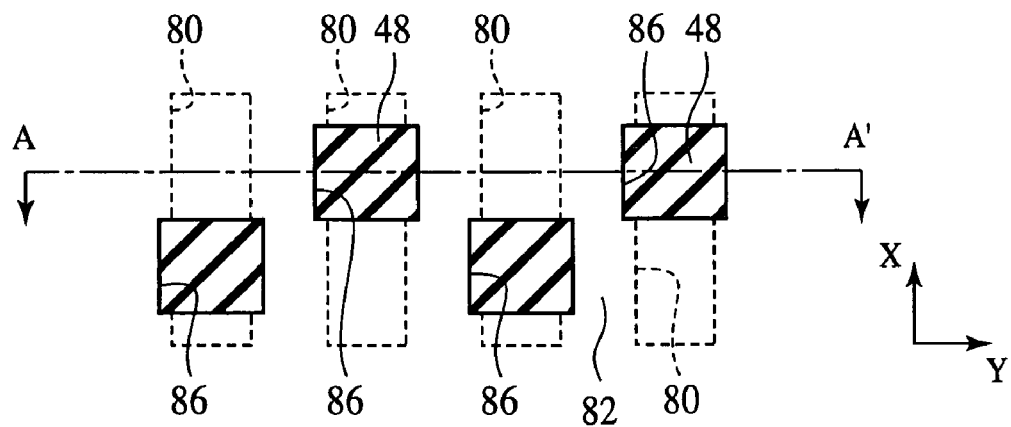

Next, as illustrated in FIGS. 13A and 13B, the silicon nitride film 72 and the silicon oxide film 50 are etched with the photoresist film 84 as the mask and with the organic insulation film 48 as the etching stopper. Thus, in the silicon nitride film 72 and the silicon oxide film 50, the openings 86 of the plane shape of the contact holes 54 are formed.

Figure 14A:
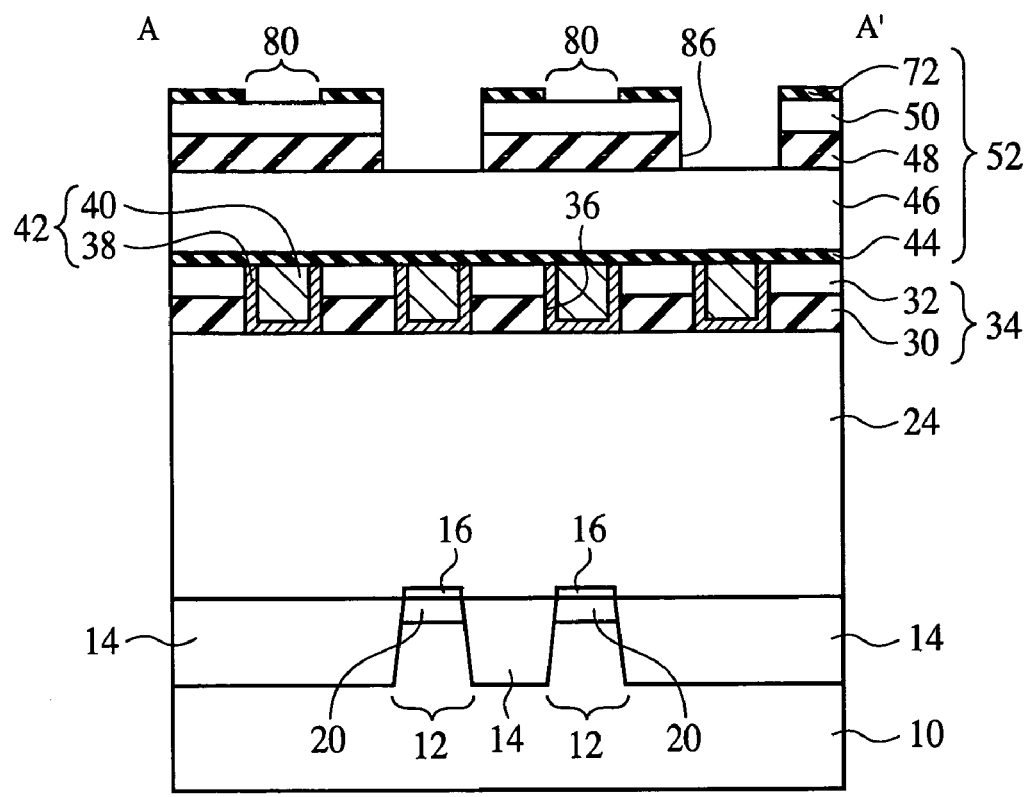
FIGS. 14A and 14B are views of the semiconductor device according to the first embodiment of the present invention in the steps of the method for fabricating the semiconductor device, which illustrate the method (Part 8).
Figure 14B:
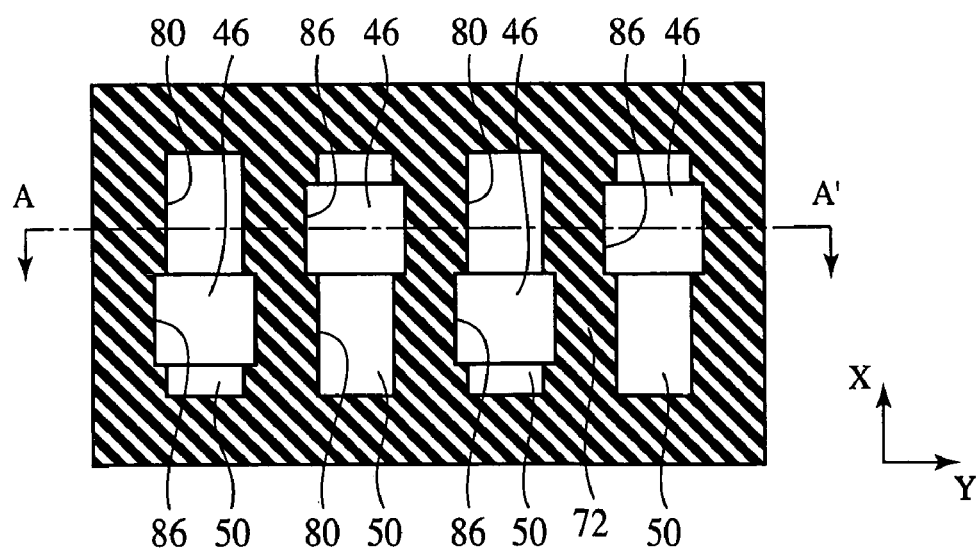

Then, as illustrated in FIGS. 14A and 14B, the organic insulation film 48 is anisotropically etched with the silicon nitride film 72 and the silicon oxide film 50 as the mask and with the silicon oxide film 46 as the etching stopper. When the organic insulation film 48 is anisotropically etched, the photo resist film 82 (see FIGS. 13A and l3B) on the silicon nitride film 72 is also etched off. Thus, the openings 86 of the plane shape of the contact holes 54 are formed down to the silicon oxide film 46.

Figure 15A:
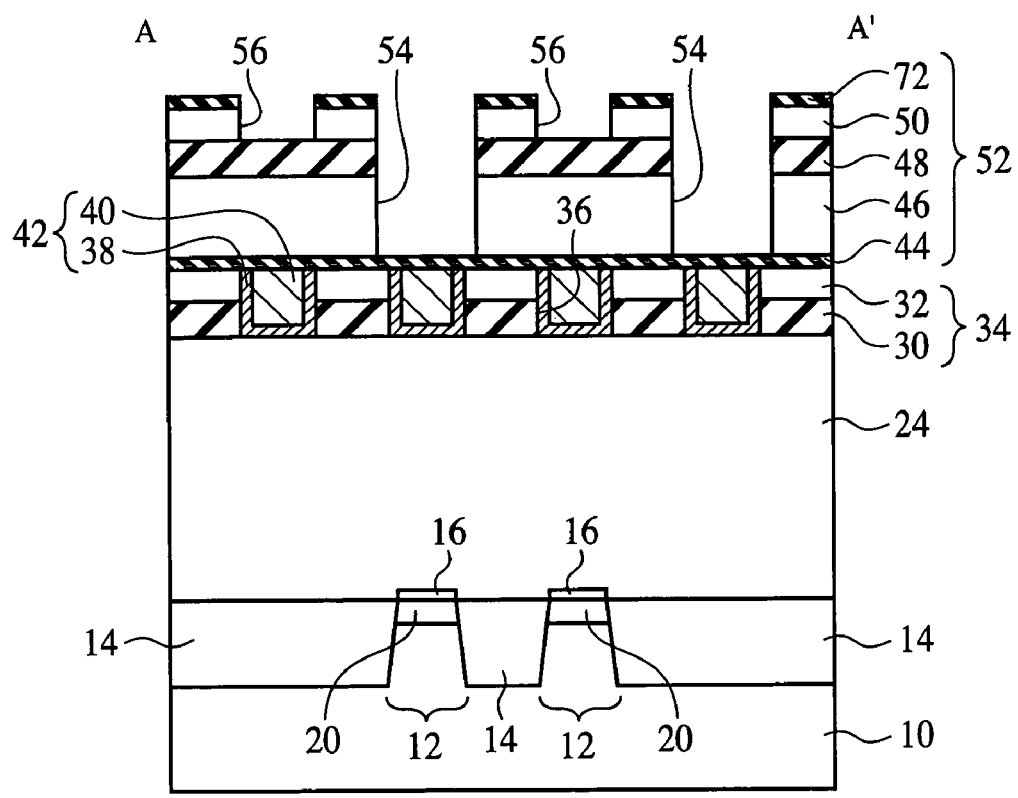
FIGS. 15A and 15B are views of the semiconductor device according to the first embodiment of the present invention in the steps of the method for fabricating the semiconductor device, which illustrate the method (Part 9).
Figure 15B:
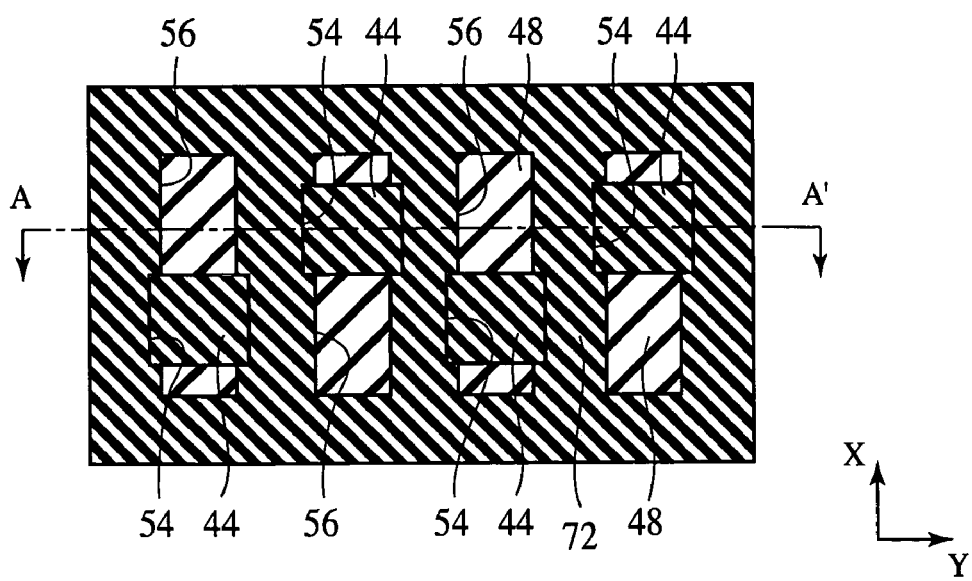

Next, as illustrated in FIGS. 15A and 15B, the silicon oxide film 50 and the silicon oxide film 46 are anisotropically etched with the silicon nitride film 72 as the mask and with the organic insulation film 48 as the etching stopper. Thus, the contact holes 54 are formed down to the silicon nitride film 44. The trenches 56 are also formed down to the organic insulation film 48.

Figure 16A:
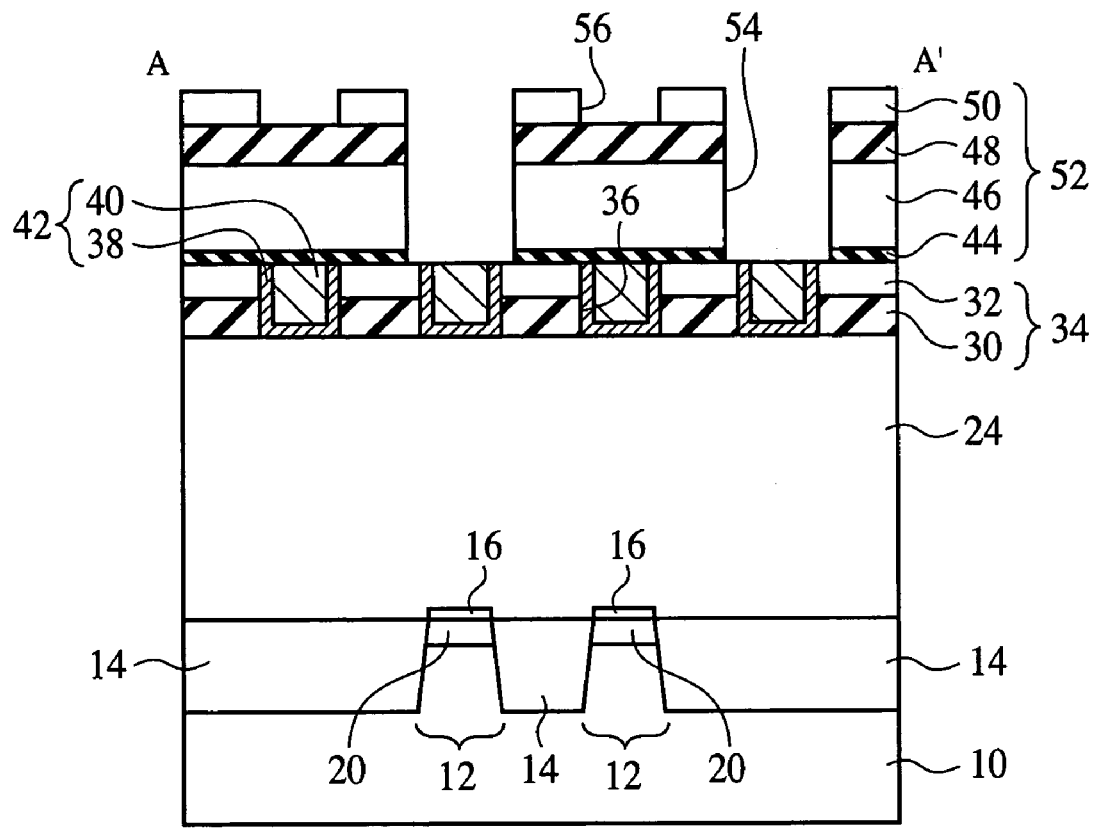
FIGS. 16A and 16B are views of the semiconductor device according to the first embodiment of the present invention in the steps of the method for fabricating the semiconductor device, which illustrate the method (Part 10).
Figure 16B:
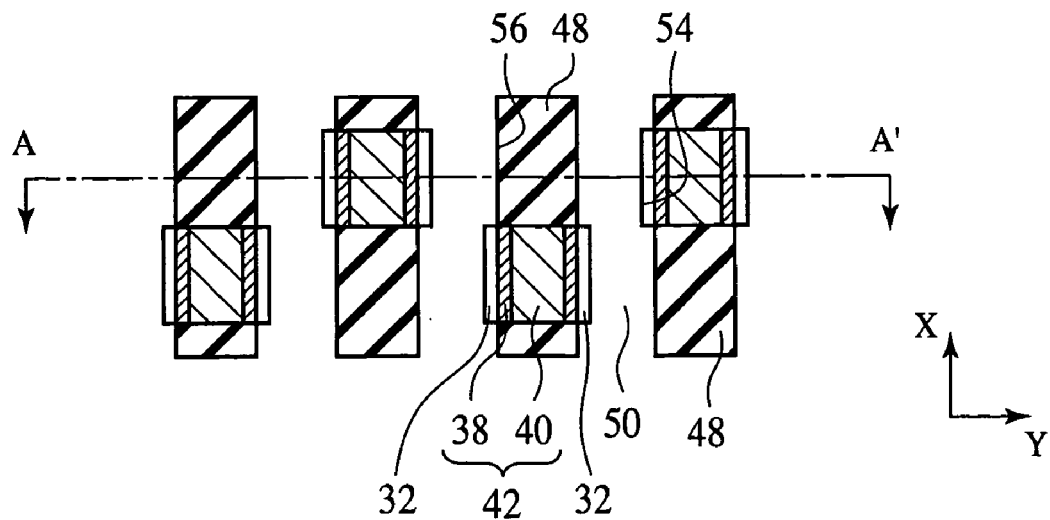

Next, as illustrated in FIGS. 16A and 16B, the silicon nitride film 72 (see FIGS. 15A and 15B) and the silicon nitride film 44 are anisotropically etched with the silicon oxide film 50 as the mask and with the silicon oxide film 32 and the silicon oxide film 46 as the etching stopper. Thus, the contact holes 54 are formed in the silicon oxide film 50, the organic insulation film 48, the silicon oxide film 46 and the silicon nitride film 44 down to the interconnections 42.

Figure 17A:
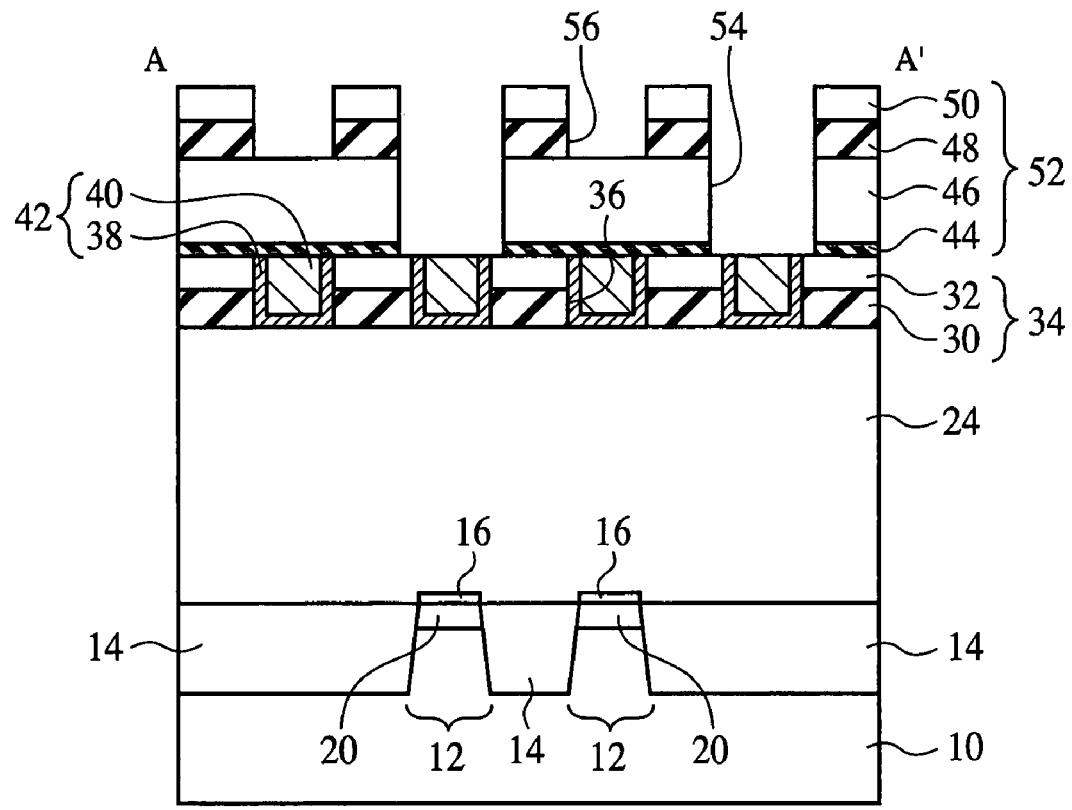
FIGS. 17A and 17B are views of the semiconductor device according to the first embodiment of the present invention in the steps of the method for fabricating the semiconductor device, which illustrate the method (Part 11).
Figure 17B:
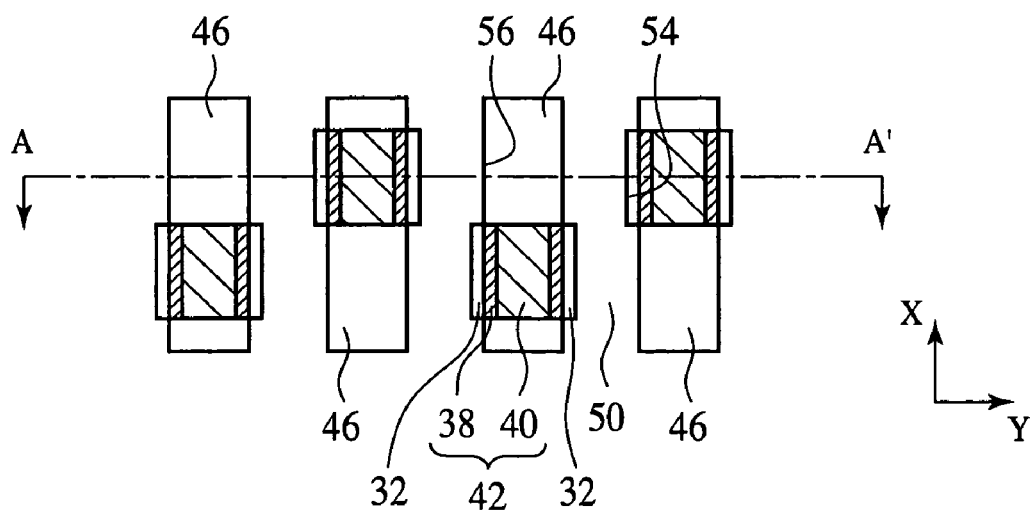

Then, as illustrated in FIGS. 17A and 17B, the organic insulation film 48 is anisotropically etched with the silicon oxide film 50 as the mask and with the silicon oxide film 46 and the silicon oxide film 32 as the etching stopper, Thus, the trenches 56 for the interconnections 64 to be buried in are formed in the organic insulation film 48 and the silicon oxide film 50.

Figure 18A:
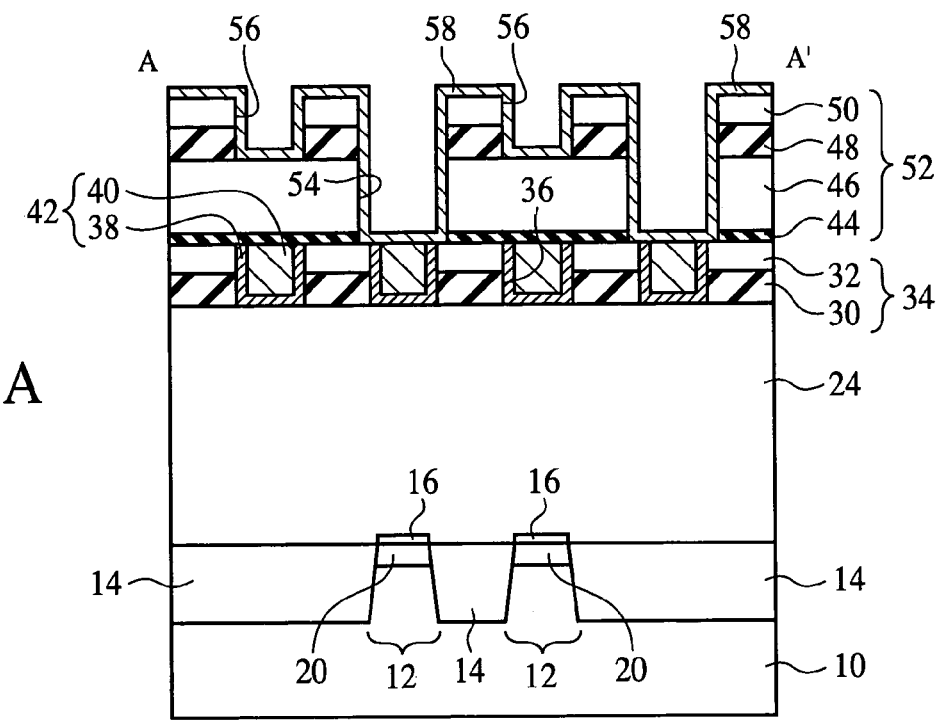
FIGS. 18A and 18B are views of the semiconductor device according to the first embodiment of the present invention in the steps of the method for fabricating the semiconductor device, which illustrate the method (Part 12).

Next, as illustrated in FIG. 18A, the barrier metal film 58 of a 50 nm-thickness TiN film is formed on the entire surface by, e.g., sputtering.

Figure 18B:
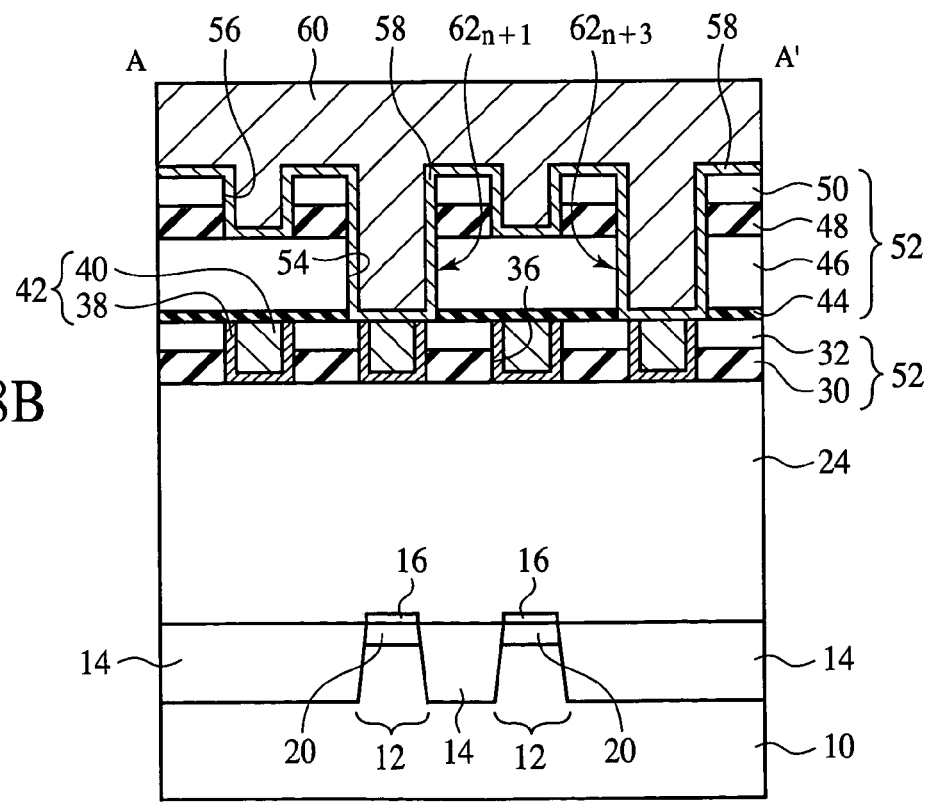

Then, as illustrated in FIG. 18B, the Cu film is formed in a 1500 nm-thickness by, e.g., plating.

Next, as illustrated in FIG. 19, the Cu film 60 and the barrier metal film 58 are polished by, e.g., CMP until the surface of the silicon oxide film 50 is exposed. Thus, the interconnections 64 of the Cu film 60 and the barrier metal film 58 are buried in the trenches 56, and the conductor plugs 62 of the Cu film 60 and the barrier metal film 58 are buried in the contact holes 54. The conductor plugs 62 and the interconnections 64 are formed integral with each other. The technique of burying the conductor plugs 62 and the interconnections 64 integrally in the insulation layer 52 thusly is called dual damascene.

Figure 20:
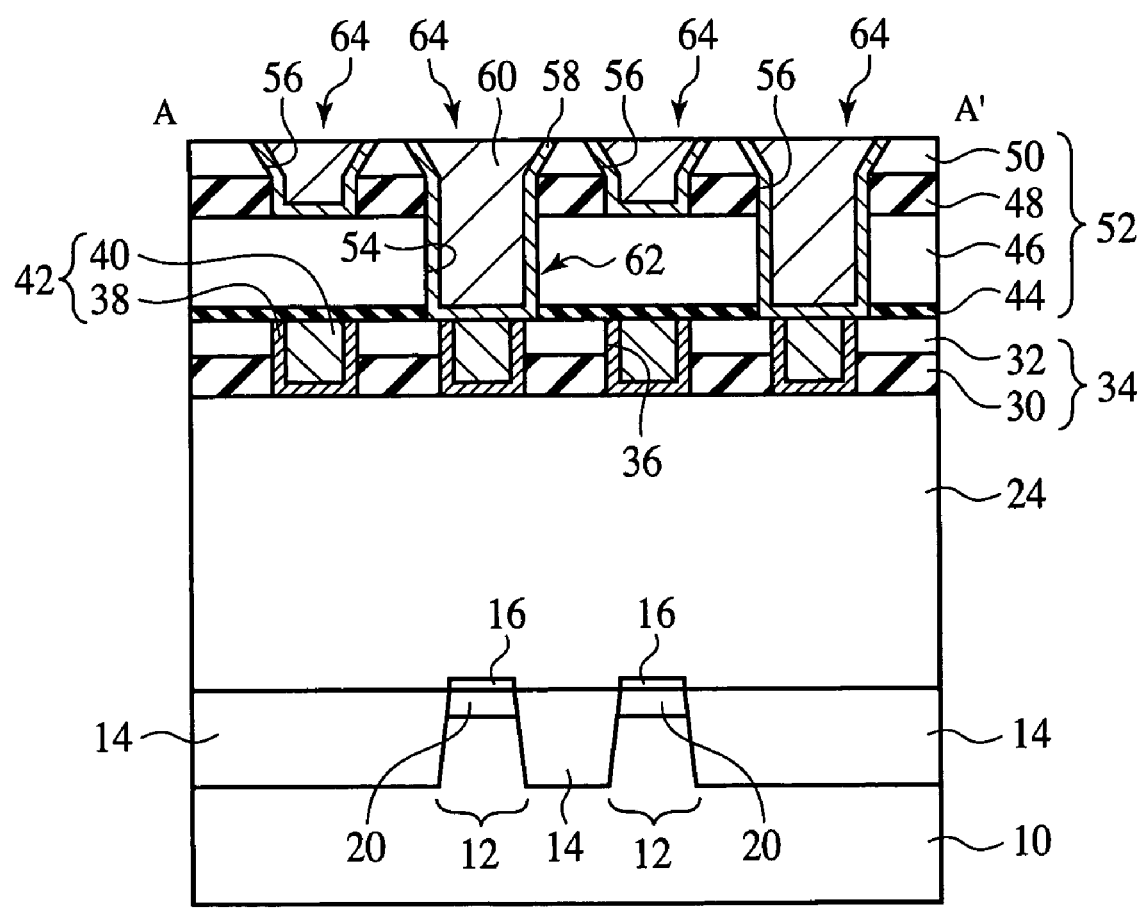
FIG. 20 is a view of the semiconductor device according to the first embodiment of the present invention in the steps of the method for fabricating the semiconductor device, which illustrate the method (Part 14).

Here, actually, the trenches 56 are formed in the configuration tapered increasingly upward in a larger width at the upper parts. FIG. 20 is a conceptual sectional view of the actually fabricated semiconductor device. As illustrated in FIG. 20, the edges of the silicon oxide film 50 are tapered. The edges of the silicon oxide film 50 are thus tapered because the selectivity ratio between the silicon nitride film 72 and the silicon oxide film 50 is not high enough in etching the silicon oxide film 50 and the silicon oxide film 46 with the silicon nitride film 72 and the organic insulation film 48 as the mask.

Figure 32:
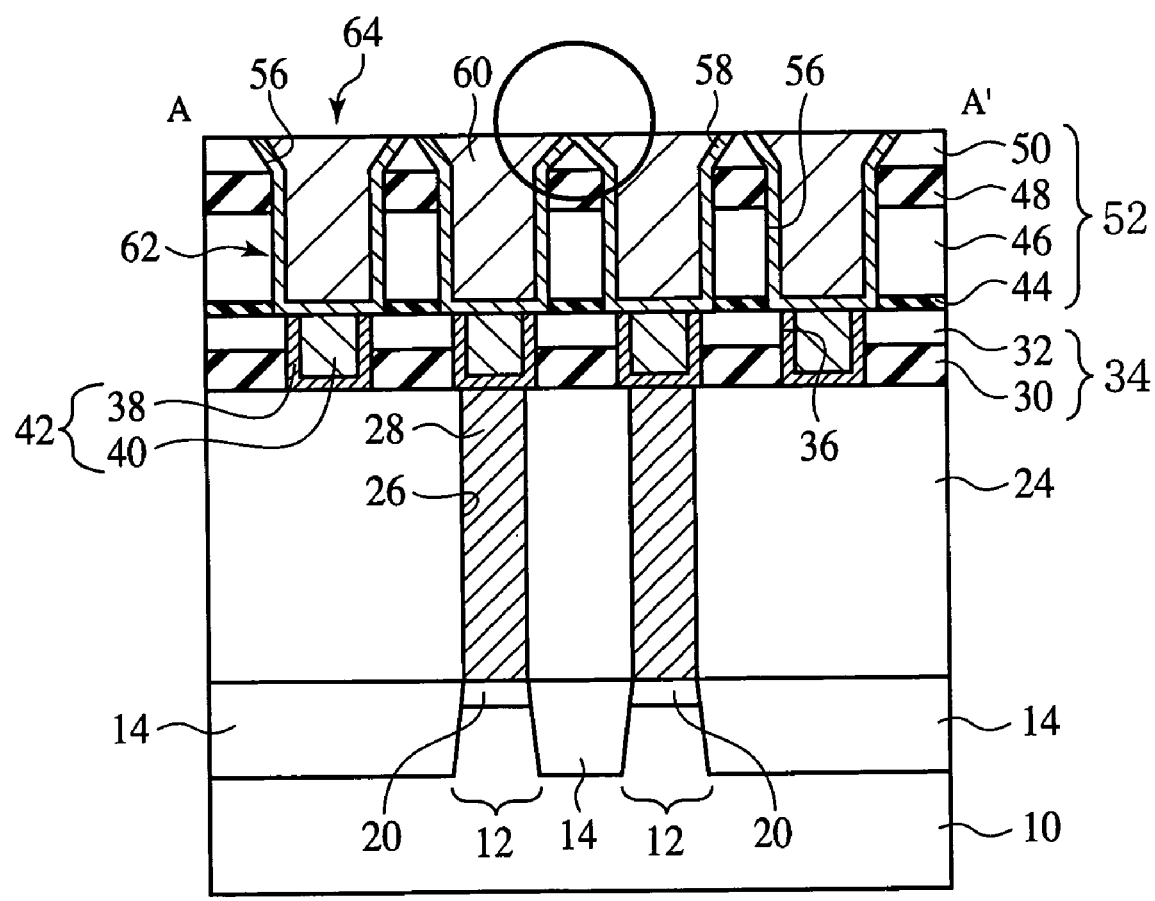
FIG. 32 is a sectional view illustrating conductor plugs simply arranged.

The interconnections 64 have a larger width locally at the parts 66 where the conductor plugs 62 are formed, and the upper parts of the trenches 56 are increasingly tapered. When the conductor plugs 62 are simply arranged, there is a risk that the adjacent interconnections 64 may short circuit with each other at the parts 66, where the interconnections 64 have the larger width. FIG. 32 is a sectional view of the semiconductor device including the conductor plugs simply arranged. In FIG. 32, the part where the interconnections 64 short circuit with each other is circled.

In contrast to this, in the present embodiment, the adjacent conductor plugs 62 are alternately offset from each other in the longitudinal direction (X direction) of the interconnections 64, whereby the parts 66 of the interconnections 64 locally having a larger width are offset from each other. Thus, according to the present embodiment, even when the trenches 56 have the upper parts thus tapered, the short circuit between the adjacent interconnections 64 can be prevented.

(Modification 1)

Figure 21:
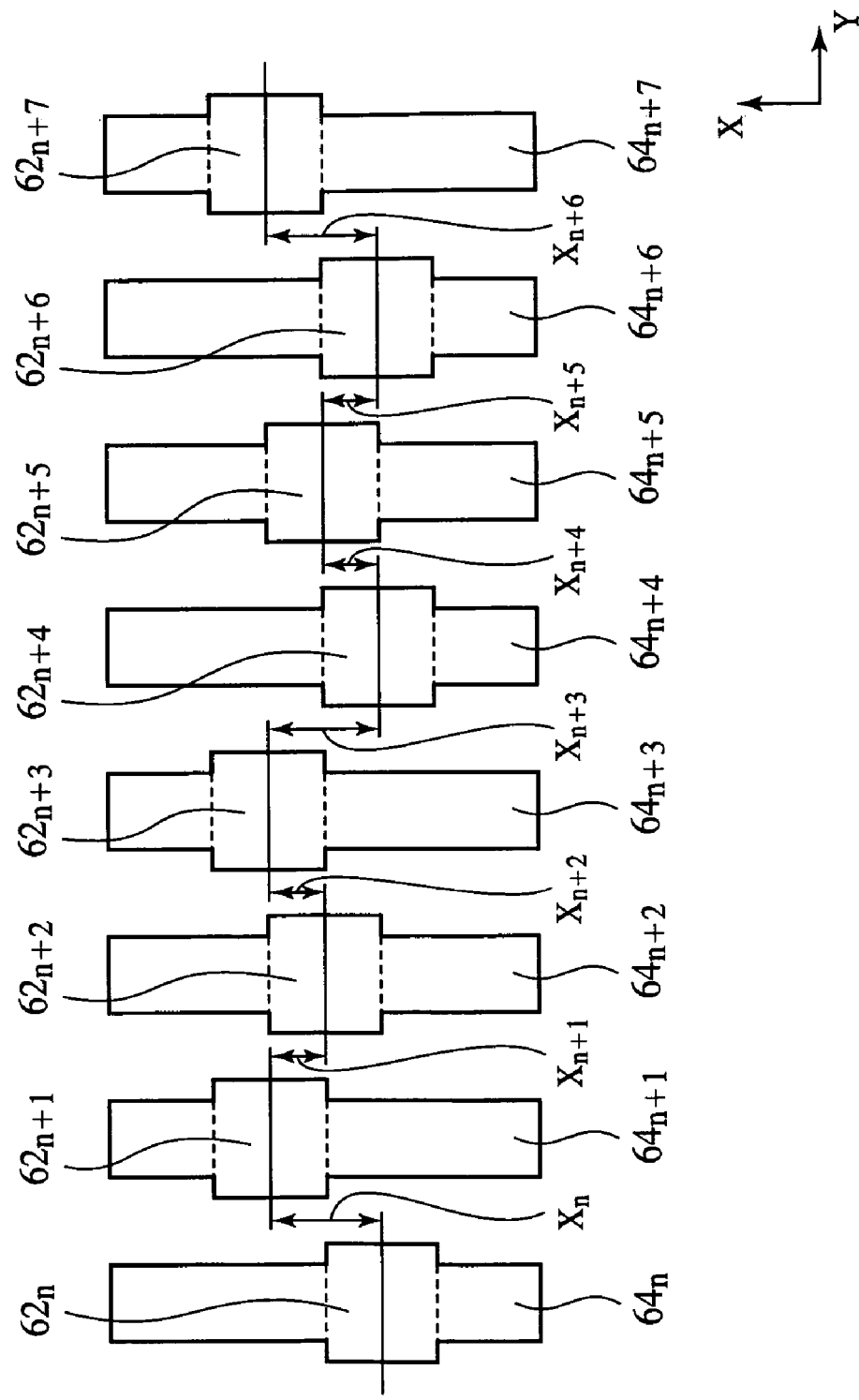
FIG. 21 is a plan view of the semiconductor device according to a modification (Part 1) of the first embodiment of the present invention.

Then, the semiconductor device according to Modification 1 of the present embodiment will be explained with reference to FIG. 21. FIG. 21 is a plan view of the semiconductor device according to the present modification.

The semiconductor device according to the present modification is characterized mainly in that the conductor plugs are off set from each other in X direction at disuniform distances.

As illustrated in FIG. 21, the conductor plug $62_{n+1}$ connected to the interconnection $64_{n+1}$ is offset from the conductor plug $62_n$ connected to the interconnection $64_n$ by $X_n$ upward as viewed in the drawing (X direction). The conductor plug $62_{n+2}$ connected to the interconnection $64_{n+2}$ is offset from the conductor plug $62_{n+1}$ connected to the interconnection $64_{n+1}$ by $X_{n+1}$ downward as viewed in the drawing. The conductor plug $62_{n+3}$ connected to the interconnection $64_{n+3}$ is offset from the conductor plug $62^{n+2}$ connected to the interconnection $64_{n+2}$ by $X_{n+2}$ upward as viewed in the drawing (X direction). The conductor plug $62_{n+4}$ connected to the interconnection $64_{n+4}$ is offset from the conductor plug $62_{n+3}$ connected to the interconnection $64_{n+3}$ by $X_{n+3}$ downward as viewed in the drawing.

The conductor plug $62_{n+5}$ connected to the interconnection $64_{n+5}$ is offset from the conductor plug $62_{n+4}$ connected to the interconnection $64_{n+4}$ by $X_{n+4}$ upward as viewed in the drawing (X direction). The conductor plug $62_{n+6}$ connected to the interconnection $64_{n+6}$ is offset from the conductor plug $62_{n+5}$ connected to the interconnection $64_{n+5}$ is offset by $X_{n+5}$ downward as viewed in the drawing. The conductor plug $62_{n+7}$ connected to the interconnection $64_{n+7}$ is offset from the conductor plug $62_{n+6}$ connected to the interconnection $64_{n+6}$ by $X_{n+6}$ upward as viewed in the drawing.

The distances $X_n$, $X_{n+1}$, $X_{n+2}$, . . . are set disuniform.

Even in a case that the conductor plugs 62 are thus offset from each other in the longitudinal direction (X direction) of the interconnections 64 at disuniform distances $X_n$, the parts 66 of the interconnections 64 having the width increased can be also distanced from each other. Thus, according to the present modification, without using an ArF exposure system and a half tone phase shift mask, which are expensive, the pitch of the interconnections 64 can be made small. Accordingly, the present modification as well can provide semiconductor devices of high integration at low costs while ensuring high fabrication yields.

(Modification 2)

Figure 22:
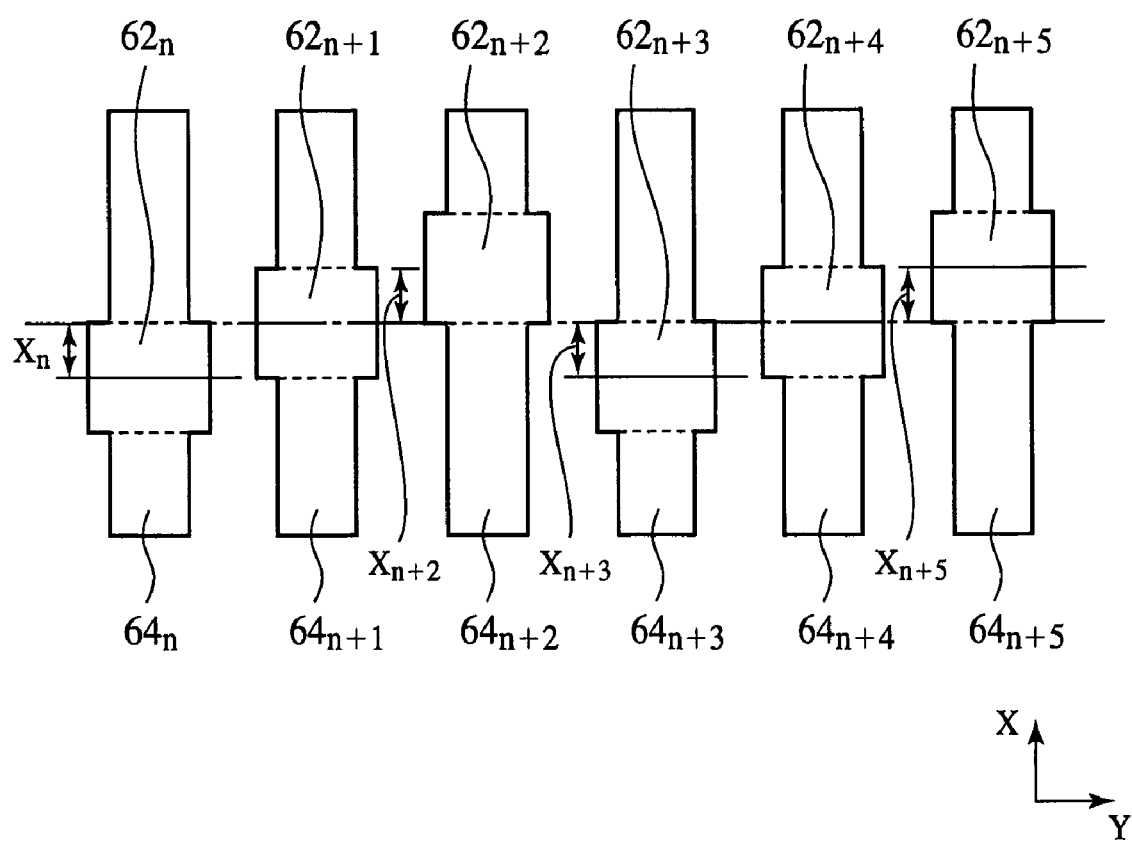
FIG. 22 is a plan view of the semiconductor device according to a modification (Part 2) of the first embodiment of the present invention.

Next, the semiconductor device according to Modification 2 will be explained with reference to FIG. 22. FIG. 22 is a plan view of the semiconductor device according to the present modification.

The semiconductor device according to the present modification is characterized mainly in that the conductor plug 62 are gradually offset in the longitudinal direction of the interconnections 64.

As illustrated in FIG. 22, the conductor plug $62_n$ connected to the interconnection $64_n$ is offset from the longitudinal center line of the interconnections 64 by $X_n$ downward as viewed in the drawing. The conductor plug $62_{n+1}$ connected to the interconnection $64_{n+1}$ is arranged, centered on the longitudinal center line of the interconnections 64. The conductor plug $62_{n+2}$ connected to the interconnection $64_{n+2}$ is offset from the longitudinal center line of the interconnections 64 by $X_{n+2}$ upward as viewed in the drawing.

The conductor plug $62_{n+3}$ connected to the interconnection $64_{n+3}$ is offset from the longitudinal center line of the interconnections 64 by $X_{n+3}$ downward as viewed in the drawing. The conductor plug $62_{n+4}$ connected to the interconnection $64_{n+4}$ is arranged, centered on the longitudinal center line of the interconnections 64. The conductor plug $62_{n+5}$ connected to the interconnection $64_{n+5}$ is offset from the longitudinal center line of the interconnections 64 by $X_{n+5}$ upward as viewed in the drawing.

In other words, the conductor plug $62_{n+1}$ is arranged at a position which is offset from the conductor plug $62_n$ in the longitudinal direction (X direction) of the interconnections 64. The conductor plug $62_{n+2}$ is arranged at a position which is offset from the conductor plug $62_{n+1}$ further in the same direction as the conductor plug $62_{n+1}$ is offset. The conductor plug $62_{n+4}$ is arranged at a position offset from the conductor plug $62_{n+3}$ in the longitudinal direction of the interconnections 64 (X direction). The conductor plugs $62_{n+5}$ is arranged at a position offset from the conductor plug $62_{n+4}$ further in the same direction as the conductor plug $62_{n+4}$ is offset.

Even in a case that the conductor plugs 62 are thus offset gradually in the longitudinal direction of the interconnections 64, the parts 66 of the interconnections 64 having an increased width can be also distanced from each other. Thus, according to the present modification as well, the interconnections 64 can be arranged at a small pitch without using an ArF exposure system and a half tone phase shift mask, which are expensive. Accordingly, the present modification as well can provide semiconductor devices of high integration at low costs while ensuring high fabrication yields.

(Modification 3)

Figure 23:
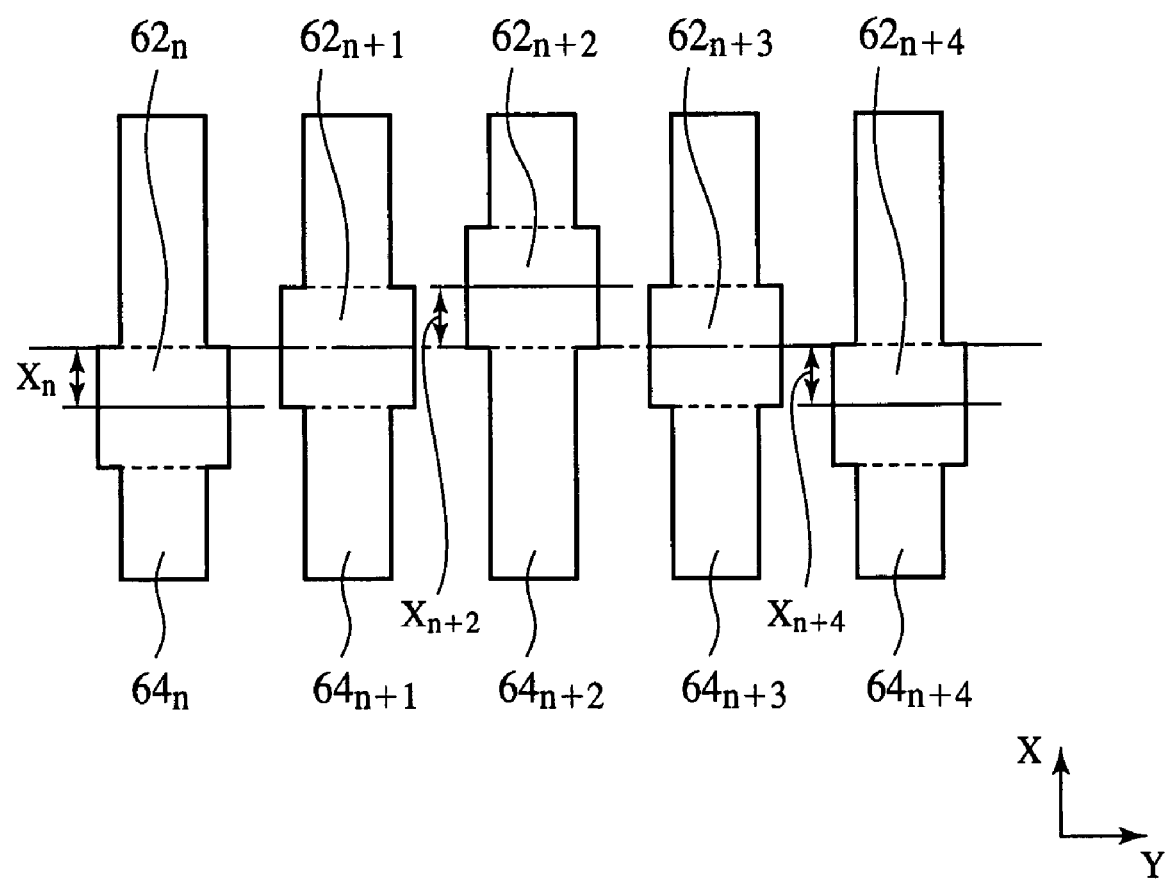
FIG. 23 is a plan view of the semiconductor device according to a modification (Part 3) of the first embodiment of the present invention.

Then, the semiconductor device according to Modification 3 of the present embodiment will be explained with reference to FIG. 23. FIG. 23 is a plan view of the semiconductor device according to the present modification.

The semiconductor device according to the present embodiment is characterized mainly in that the conductor plugs 62 are offset gradually in the longitudinal direction (X direction) of the interconnections 64.

As illustrated in FIG. 23, the conductor plug $62_n$ connected to the interconnection $64_n$ is offset from the longitudinal center line of the interconnections 64 by $X_n$ downward as viewed in the drawing. The conductor plug $62_{n+1}$ connected to the interconnection $64_{n+1}$ is arranged, centered on the longitudinal center line of the interconnections 64. The conductor plugs $62_{n+2}$ connected to the interconnection $64_{n+2}$ is offset along the longitudinal center line of the interconnections 64 by $X_{n+2}$ upward as viewed in the drawing.

The conductor plug $62_{n+3}$ connected to the interconnection $64_{n+3}$ is arranged, centered on the longitudinal center line of the interconnections 64. The conductor plugs $62_{n+4}$ connected to the interconnection $64_{n+4}$ is offset from the longitudinal center line of the interconnections 64 by $X_{n+4}$ downward as viewed in the drawing.

Even in a case that the conductor plugs 62 are offset from each other thus gradually, the parts 66 of the interconnections 64 having an increased width can be also distanced from each other. Thus, according to the present modification, the interconnections 64 can be arranged at a small pitch without using an ArF exposure system and a half tone phase shift mask, which are expensive. Accordingly, the present modification can provide semiconductor devices of high integration at low costs while ensuring high fabrication yields.

A Second Embodiment

Figure 24A:
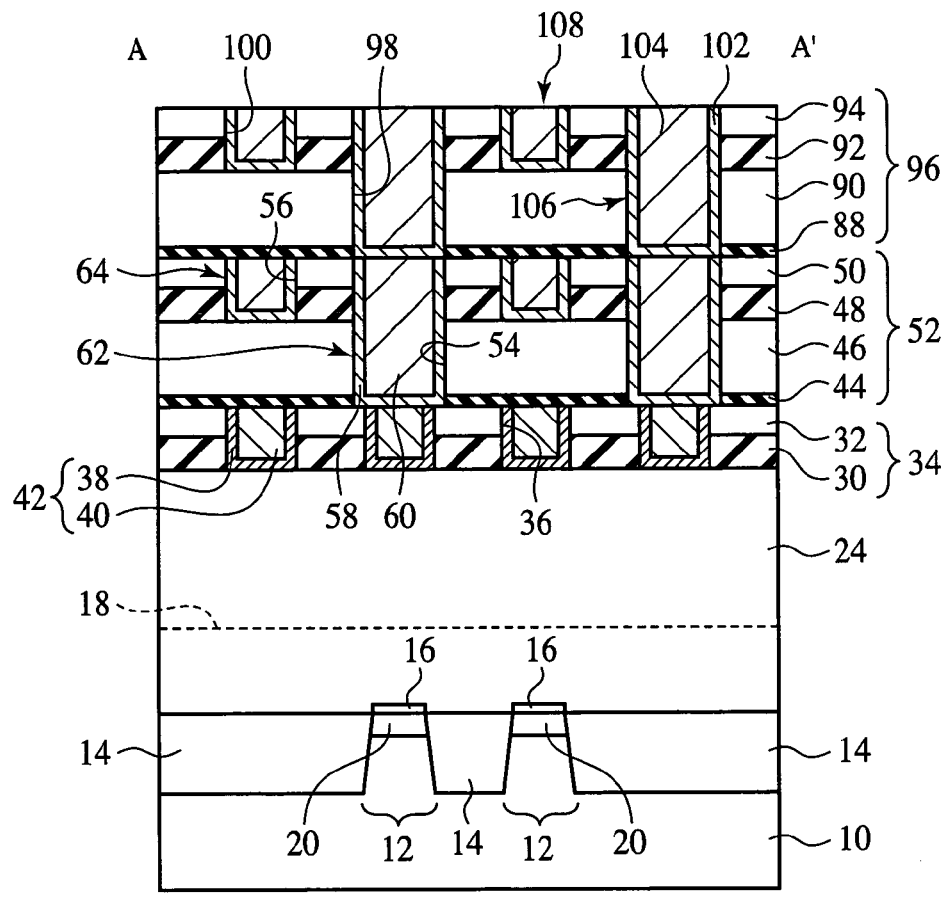
FIGS. 24A and 24B are a sectional view and a plan view of the semiconductor device according to a second embodiment of the present invention.
Figure 24B:
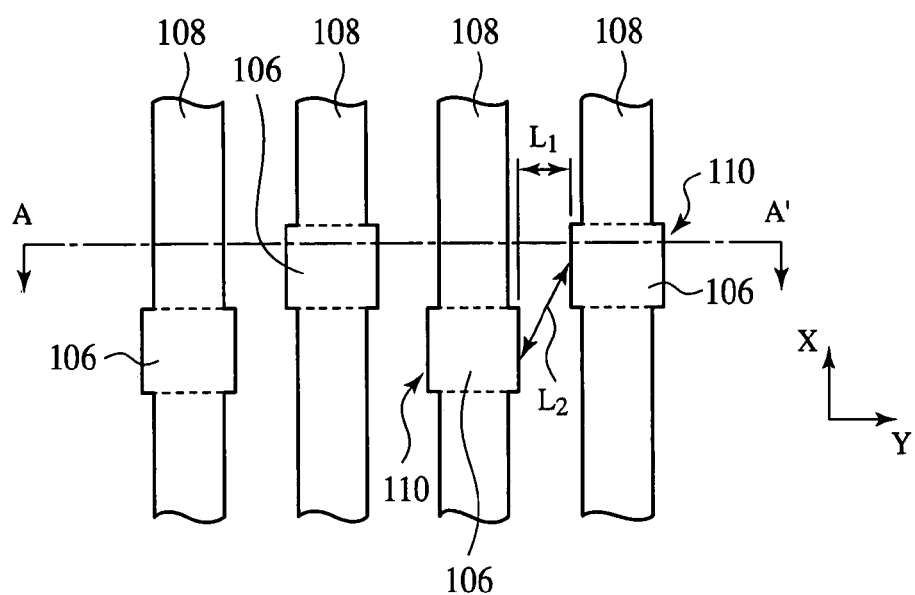
Figure 25:
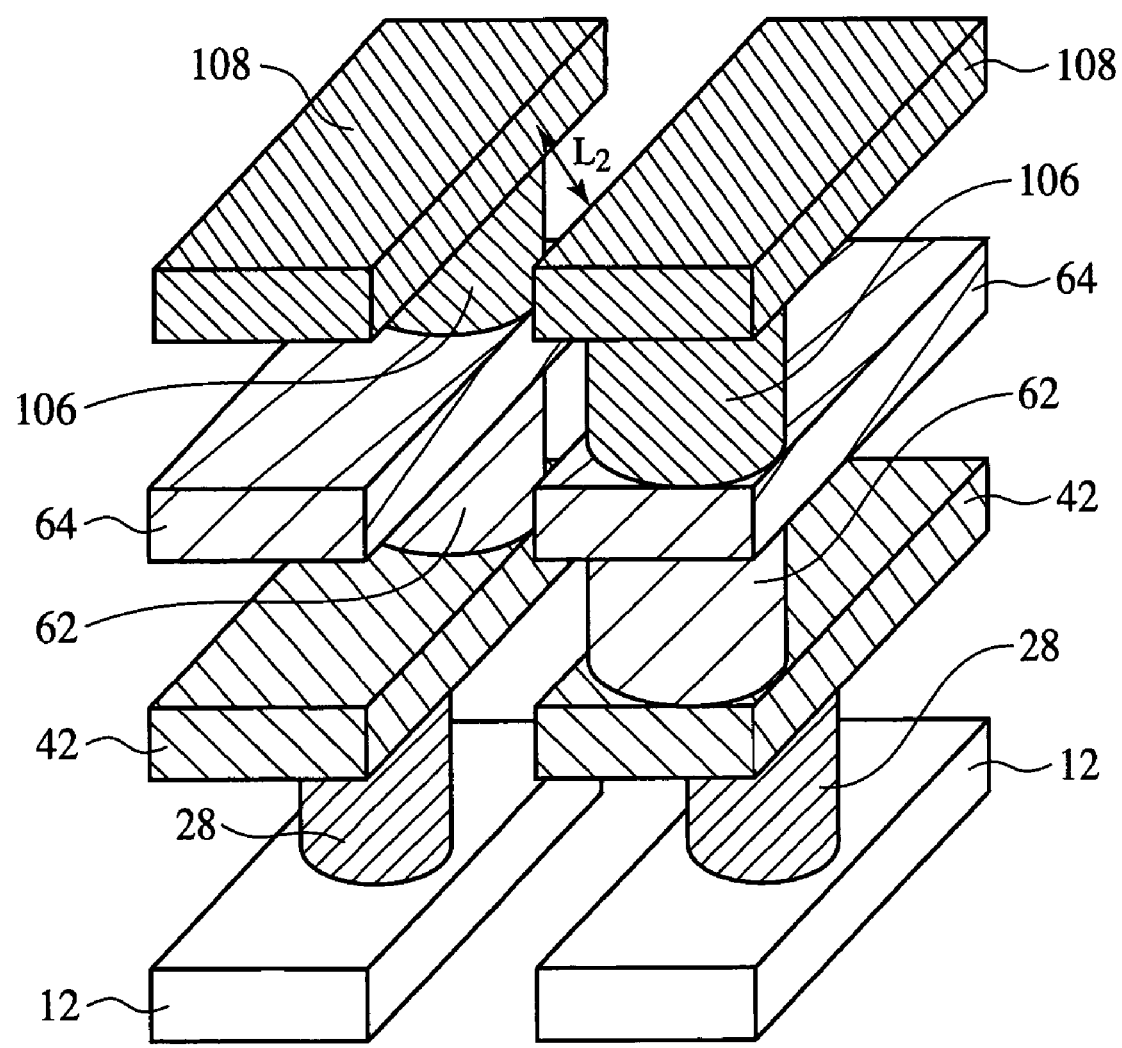
FIG. 25 is a perspective view of apart of the semiconductor device according to the second embodiment of the present invention.
Figure 26:
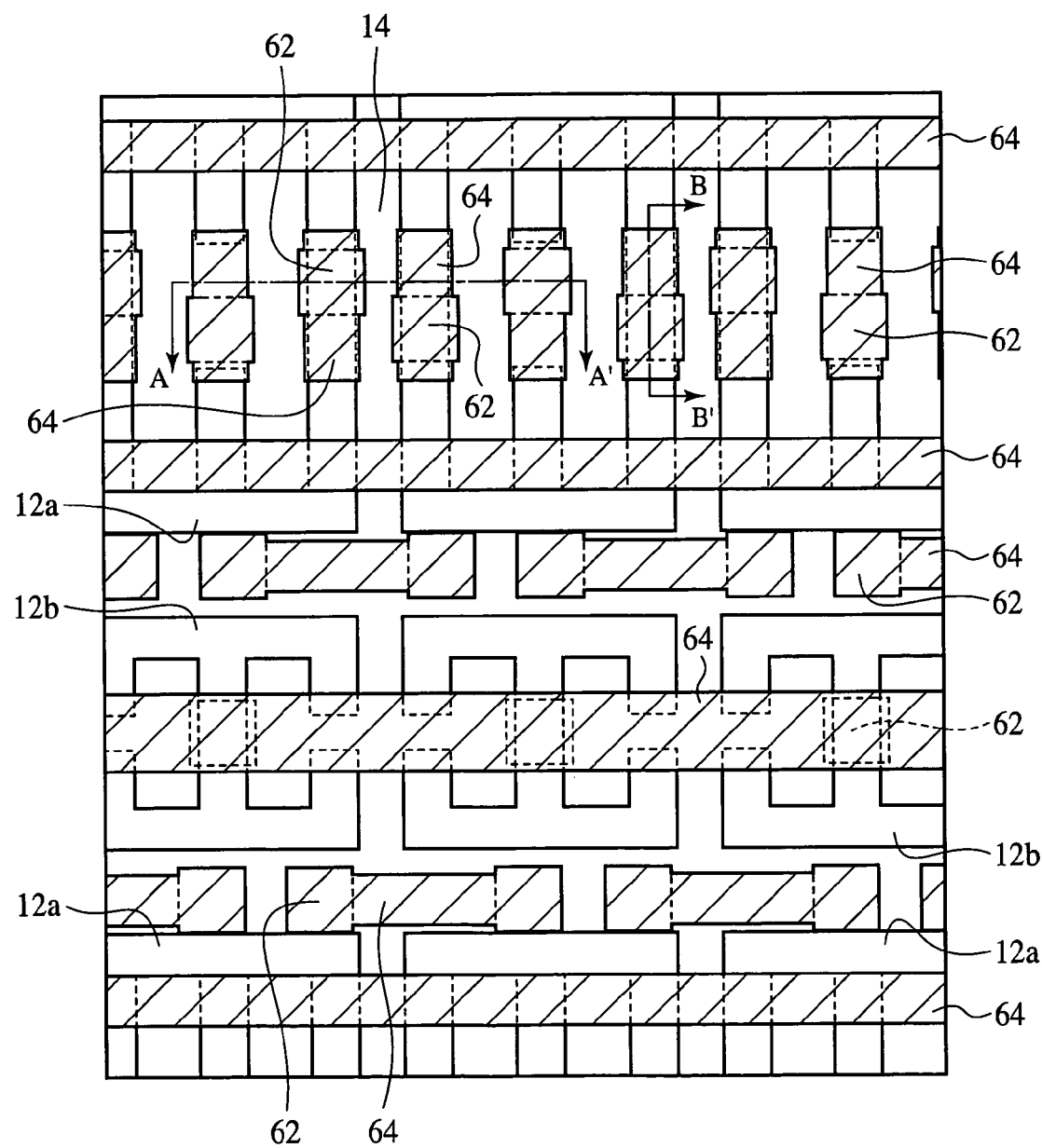
FIG. 26 is a plan view of the semiconductor device according to the second embodiment of the present invention (Part 1).
Figure 27:
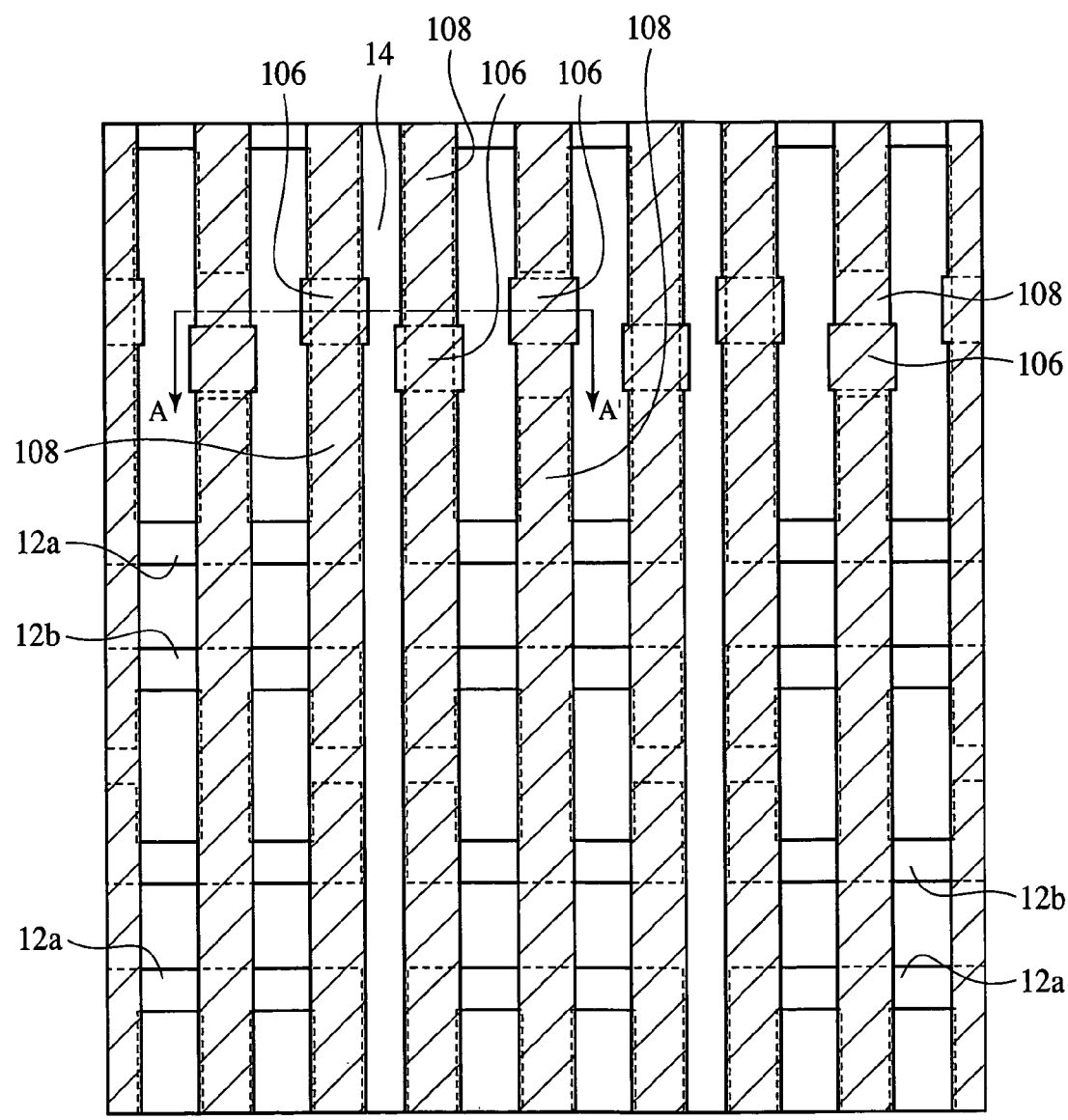
FIG. 27 is a plan view of the semiconductor device according to the second embodiment of the present invention (Part 2).

The semiconductor device according to a second embodiment of the present invention will be explained with reference to FIGS. 24A to 27. FIGS. 24A and 24B are sectional views of the semiconductor device according to the present embodiment. FIG. 25 is a perspective view of a part of the semiconductor device according to the present embodiment. FIGS. 26 and 27 are plan views of the semiconductor device according to the present embodiment. FIG. 26 illustrates mainly a layout of conductor plugs 62 and a second metal interconnection layer 64. FIG. 27 illustrates a layout of mainly conductor plugs 106 and a third metal interconnection layer 108. The same members of the present embodiment as those of the semiconductor device according to the first embodiment and the method for fabricating the semiconductor device illustrated in FIGS. 1A to 23 are represented by the same reference numbers not to repeat or to simplify their explanation.

The semiconductor device according to the present embodiment is characterized mainly in that conductor plugs 62 and interconnections 64 are formed, and other conductor plugs 106 and other interconnections 108 are further formed on the conductor plugs 62 and the interconnections 64, and said other conductor plugs 106 are offset from each other in the longitudinal direction of said other interconnections 108, and that said conductor plugs 106 are positioned above the regions where the conductor plugs 62 are formed.

As illustrated in FIGS. 24A and 24B, a silicon nitride film 88, a silicon oxide film 90, an organic insulation film 92 and a silicon oxide film 94 are sequentially formed the latter on the former on a layer film 52 with the conductor plugs 62 and the interconnections 64 buried in. The silicon nitride film 88, the silicon oxide film 90, the organic insulation film 92 and the silicon oxide film 94 constitute a layer film 96.

Contact holes 98 are formed in the layer film 96 down to the interconnections 64. Trenches 100 are formed in the organic insulation film 92 and silicon oxide film 94 of the layer film 96. The trenches 100 are connected to the contact holes 98.

A barrier metal 102 of, e.g., TiN is formed on the inside walls of the trenches 100 and the contact holes 98. A Cu film 104 is buried in the trenches 100 and-the contact holes 98 with the barrier metal film 102 formed in. Parts of the barrier metal film 102 and the Cu film 104, which are buried in the contact holes 98 constitute the conductor plugs 106. Parts of the barrier metal film 102 and the Cu film 104, which are buried in the trenches 100 constitute the interconnections 108. The conductor plugs 106 and the interconnections 108 are formed integral with each other. The interconnections 108 constitute a third metal interconnection layer.

The conductor plugs 106 are offset from each other alternately in the longitudinal direction (X direction) of the interconnections 108. The conductor plugs 106 are positioned respectively above the regions where the conductor plugs 62 are formed. The conductor plugs 106 are offset from each other so as to present the short circuit between the interconnections 108, as described above.

The semiconductor device according to the present embodiment is thus constituted.

According to the present embodiment, the conductor plugs 106 are offset from each other in the longitudinal direction of the interconnections 108 above the conductor plugs 62 and the interconnections 64, whereby parts 110 of the interconnections 108 having an increased width can be distanced from each other. Furthermore, the conductor plugs 106 are positioned above the regions where the conductor plugs 62 are formed, whereby the short circuit between the lower interconnections 64 and the upper conductor plugs 106 can be prevented. Thus, according to the present embodiment, an ArF exposure system and a half tone phase shift mask, which are expensive, are not necessary to make the pitch between the interconnections 64 small and make the pitch of the interconnections 108 positioned above the interconnections 64 small. Thus, the semiconductor device according to the present embodiment can have high integration and have low costs while ensuring high fabrication yields, even when the semiconductor device includes a number of metal interconnection layers are formed.

The conductor plugs 106 and the interconnections 108 can be formed in the same way as the conductor plugs 62 and the interconnections 64.

Other conductor plugs may be arranged further above the conductor plugs 106.

A Third Embodiment

Figure 28:
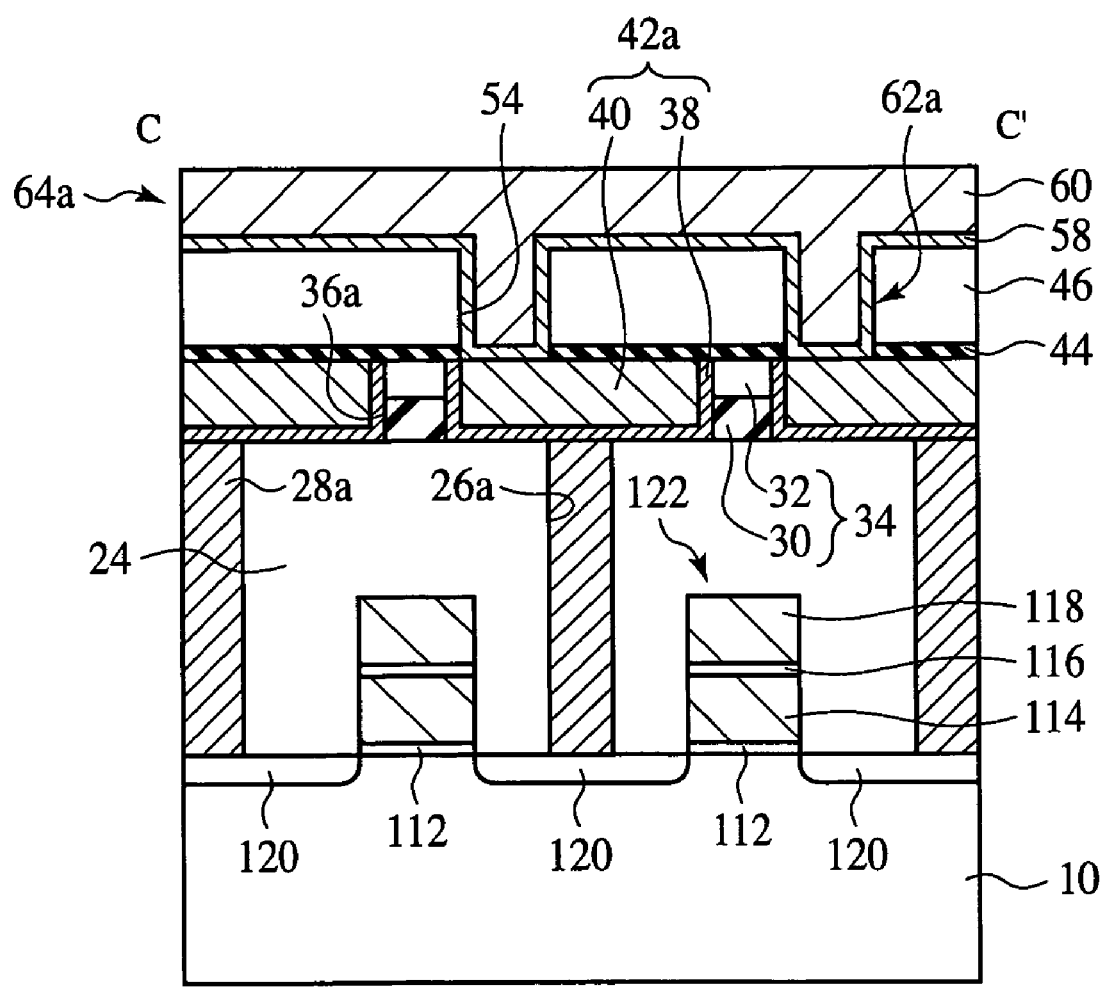
FIG. 28 is a sectional view of the semiconductor device according to a third embodiment of the present invention.
Figure 29:
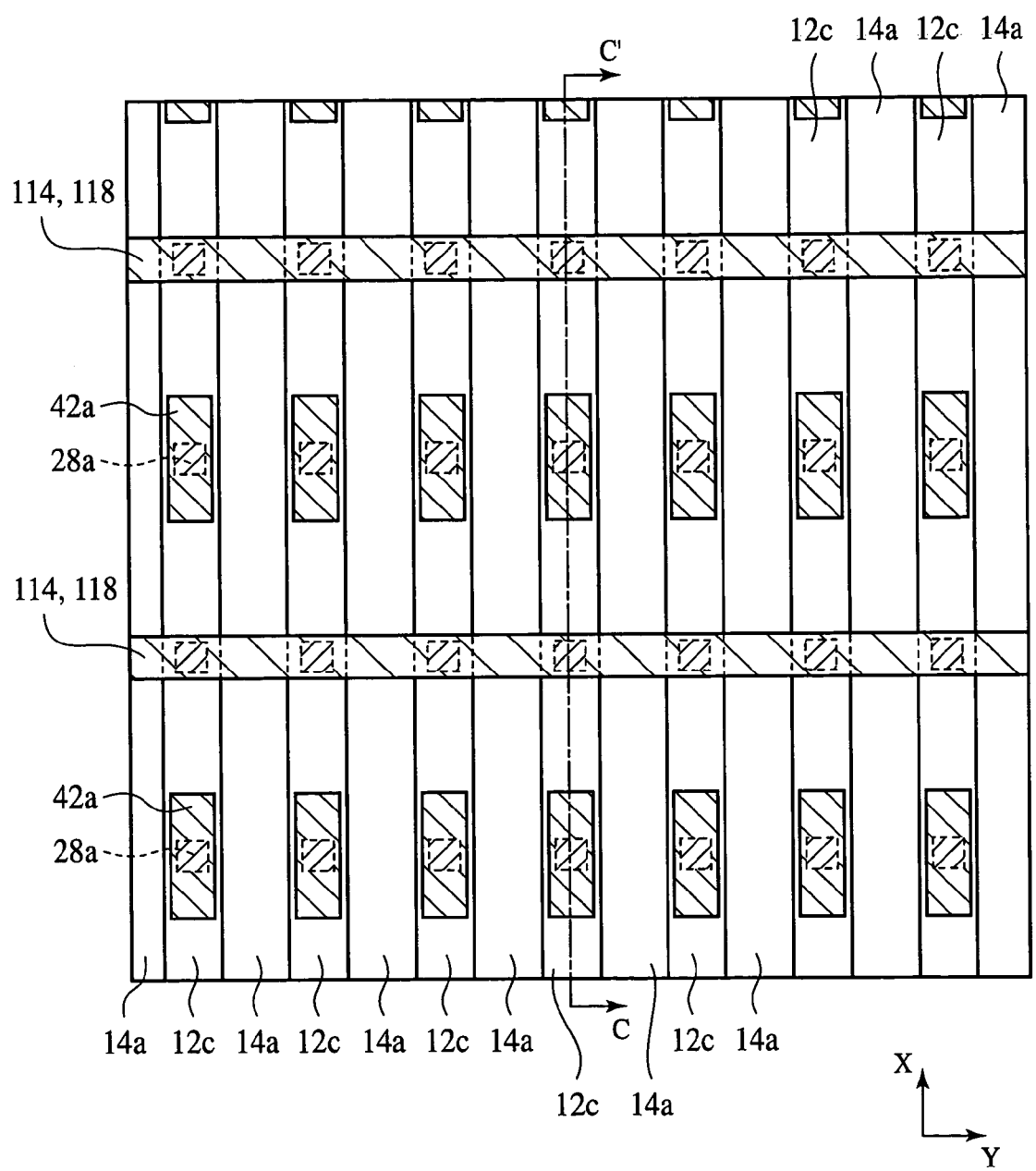
FIG. 29 is a plan view of the semiconductor device according to the third embodiment of the present invention (Part 1).
Figure 30:
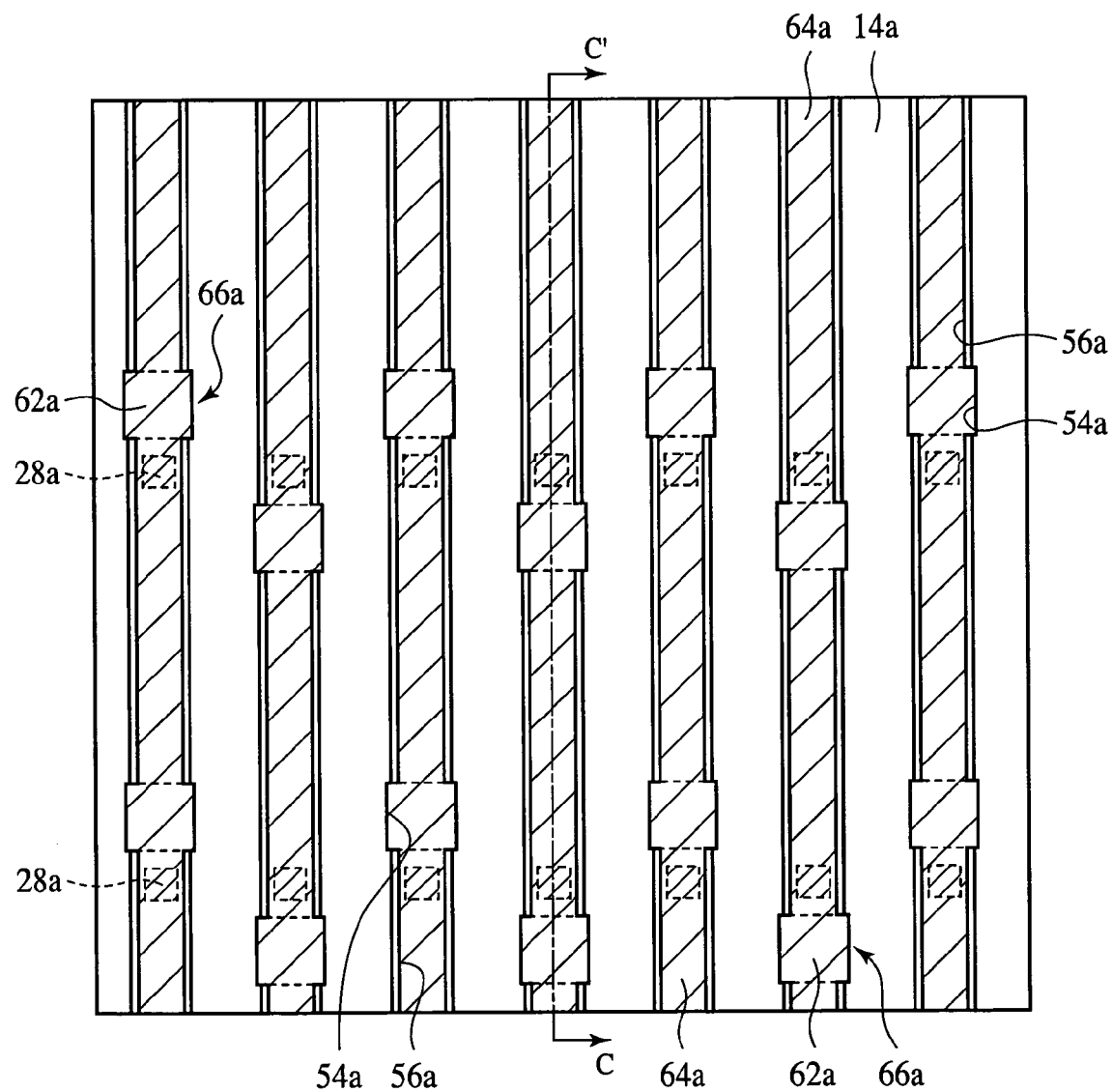
FIG. 30 is a plan view of the semiconductor device according to the third embodiment of the present invention (Part 2).
Figure 31:
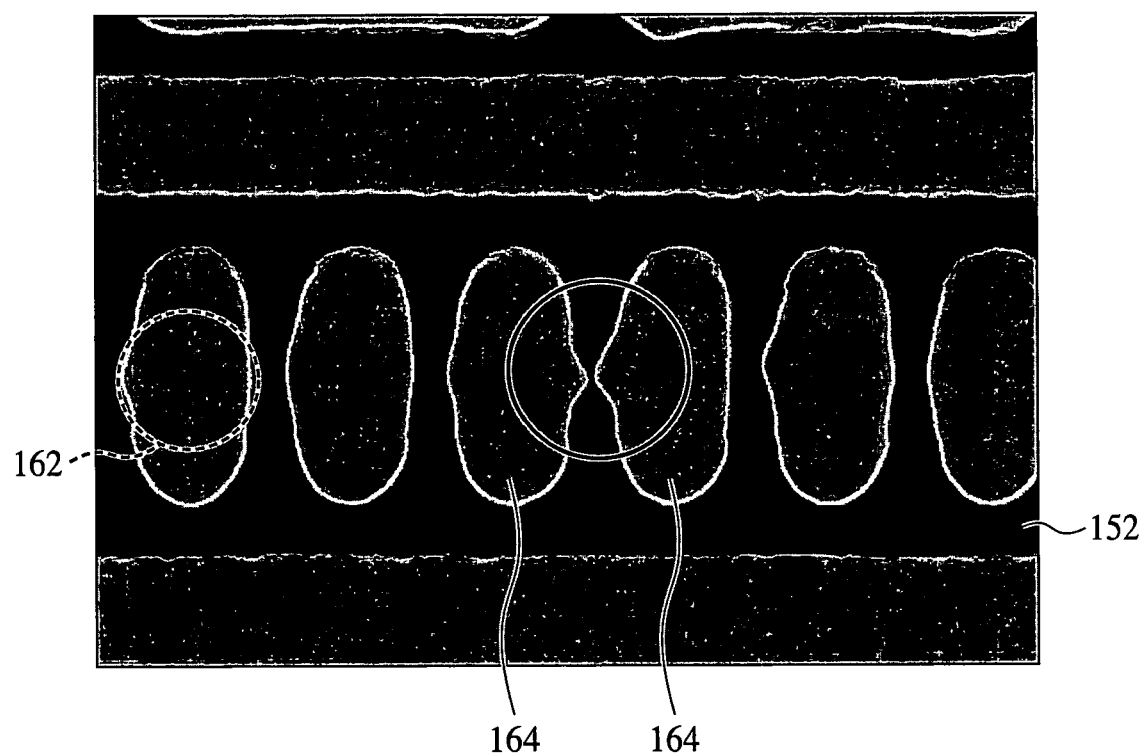
FIG. 31 is a plan view illustrating the short circuit between adjacent interconnections.

The semiconductor device according to a third embodiment of the present invention will be explained with reference to FIGS. 28 to 30. FIG. 28 is a sectional view of the semiconductor device according to the present embodiment. FIGS. 29 and 30 are plan views of the semiconductor device according to the present embodiment. FIG. 29 illustrates a layout mainly of device regions 12a, device isolation regions 14a, floating gate electrodes 114, control gate electrodes 116, conductor plugs 28a and a first metal interconnection layer 42a. FIG. 30 illustrates a layout mainly of conductor plugs 62a and a second metal interconnection layer 64a. FIG. 28 is the sectional view along the line C–C' in FIGS. 29 and 30. The same members of the present embodiment as those of the semiconductor device according to the first or the second embodiment and the method for fabricating the semiconductor device illustrated in FIGS. 1A to 27 are represented by the same reference numbers not to repeat or to simplify their explanation.

In the present embodiment, the principle of the present invention is applied to the memory cell unit of a FRASH memory.

As illustrated in FIG. 29, the device isolation regions 14a for defining the device regions 12c are formed in a semiconductor substrate 10.

As illustrated in FIG. 28, the floating gate electrode 114 are formed on the semiconductor substrate 10 with a tunnel insulation film 112 formed therebetween. The floating gate electrodes 114 are formed, crossing the device regions 12.

The control gate electrodes 118 are formed on the floating gate electrodes 114 with an insulation film 116 formed therebetween.

A source/drain diffused layer 120 is formed in the device regions 12 on both sides of the floating gate electrodes 114 and the control gate electrodes 118.

Thus, memory cells 122 each including the floating gate electrodes 114, the control gate electrodes 118 and the source/drain diffused layer 120 are constituted.

An inter-layer insulation film 24 is formed on the semiconductor substrate 10 with the memory cells 122 formed on.

Contact holes 26a are formed in the inter-layer insulation film 24 down to the source/drain diffused layer 120.

The conductor plugs 28a of, e.g., tungsten are buried in the contact holes 26a.

On the inter-layer insulation film 24 with the conductor plugs 28a buried in, an organic insulation film 30 and a silicon oxide film 32 are sequentially formed. The organic insulation film 30 and the silicon oxide film 32 constitute a layer film 34.

Trenches 36a are formed in the organic insulation film 30 and the silicon oxide film 32 down to the inter-layer insulation film 24 and the conductor plugs 28a.

A barrier metal film 38 is formed on the inside surface of the trenches 36a. A Cu film 40 is buried in the trenches 36a with the barrier metal film 38 formed in. The Cu film 40 and the barrier metal film 38 constitute the interconnections 42a.

On the layer film 34 with the interconnections 42a buried in, a silicon nitride film 44, a silicon oxide film 46, an organic insulation film 48 and a silicon oxide film 50 are sequentially formed the latter on the former. The silicon nitride film 44, the silicon oxide film 46, the organic insulation film 48 (see FIGS. 1A and 1B) and the silicon oxide film 50 (see FIGS. 1A and 1B) constitute a layer film 52 (see FIGS. 1A and 1B).

Contact holes 54a are formed in the layer film 52 down to the interconnections 42a. Trenches 56a (see FIG. 30) are formed in the organic insulation film 48 and the silicon oxide film 50 of the layer film 52.

A barrier metal film 58 is formed on the inside surfaces of the trenches 56a and the contact holes 54a. A Cu film 60 is buried in the trenches. 56a and the contact holes 54a with the barrier metal film 58 formed in. Parts of the Cu film 60 and the barrier metal film 58 buried in the trenches 56a constitute the interconnections 64a. Parts of the Cu film 60 and the barrier metal film 58 buried in the contact holes 54 constitute the conductor plugs 62a. The conductor plugs 62a and the interconnections 64a are formed integral with each other by dual damascene. The interconnections 64a constitute the second metal interconnection layer.

As illustrated in FIG. 30, the conductor plugs 62a are offset from each other in the longitudinal direction (X direction) of the interconnections 64a. The conductor plugs 62a are offset from each other in the longitudinal direction of the interconnections 64a, whereby parts 66a of the interconnections 64a having an increased width can be distanced from each other. Thus, according to the present embodiment as well, the interconnections 64 can be arranged at a small pitch without using an ArF exposure system and a half tone phase shift mask, which are expensive. Thus, the semiconductor device according to the present embodiment can have high integration and low costs while ensuring high fabrication yields.

Modified Embodiments

The present invention is not limited to the above-described embodiments and can cover other various modifications.

For example, in the above-described embodiments, the present invention has been explained by means of an SRAM and a FLASH memory. However, the present invention is applicable to any other semiconductor device.

In the semiconductor device according to the second and the third embodiments, the conductor plugs 62, 106 maybe arranged in the layout illustrated in FIGS. 21 to 23.

In the semiconductor device according to the third embodiment, other conductor plugs may be further formed above the conductor plugs 62a. In this case, preferably, said other conductor plugs are arranged, positioned above the regions where the conductor plugs 62a are formed in, as in the semiconductor device according to the second embodiment. Further other conductor plugs may be formed above said other conductor plugs.

In the above-described embodiments, the conductor plugs and the interconnections are formed by dual damascene. However, the conductor plugs and the interconnections may not be formed by dual damascene; for example, it is possible that after the conductor plugs have been buried in the insulation layer, the interconnections to be connected to the conductor plugs are formed on the conductor plugs and the insulation layer.

What is claimed is:

1. A semiconductor device comprising:
   a first conductive pattern;
   a second conductive pattern formed adjacent to the first conductive pattern and being in substantially parallel with the first conductive pattern;
   a first conductor plug formed below a prescribed region of the first conductive pattern and connected to the first conductive pattern;
   a second conductor plug formed over the prescribed region of the first conductive pattern and connected to the first conductive pattern;
   a third conductor plug formed below a prescribed region of the second conductive pattern and connected to the second conductive pattern, the prescribed region of the second conductive pattern being adjacent to the prescribed region of the first conductive pattern;
   a fourth conductor plug formed over the prescribed region of the second conductive pattern and connected to the second conductive pattern;
   a third conductive pattern formed above the first conductive pattern and connected to the second conductor plug; and
   a fourth conductive pattern formed above the second conductive pattern and connected to the fourth conductor plug,
   the fourth conductor plug being arranged at a position which is offset from the second conductor plug.

2. A semiconductor device according to claim 1, comprising:
   a fifth conductive pattern formed adjacent to the second conductive pattern and being substantially parallel with the second conductive pattern;
   a fifth conductor plug formed below a prescribed region of the fifth conductive pattern and connected to the fifth conductive pattern, the prescribed region of the fifth conductive pattern being adjacent to the prescribed region of the second conductive pattern;

a sixth conductor plug formed over the prescribed region of the fifth conductive pattern and connected to the fifth conductive pattern; and a sixth conductive pattern formed above the fifth conductive pattern and connected to the sixth conductor plug, the sixth conductor plug being arranged at a position which is offset in a direction opposite to a direction where the fourth conductor plug is offset.

3. A semiconductor device according to claim 1, comprising:

a fifth conductive pattern formed adjacent to the second conductive pattern and being substantially in parallel with the second conductive pattern;

a fifth conductor plug formed below a prescribed region of the fifth conductive pattern and connected to the fifth conductive pattern, the prescribed region of the fifth conductive pattern being adjacent to the prescribed region of the second conductive pattern;

a sixth conductor plug formed over the prescribed region of the fifth conductive pattern and connected to the fifth conductive pattern; and a sixth conductive pattern formed above the fifth conductive pattern and connected to the sixth conductor plug, the sixth conductor plug being arranged at a position which is offset from the fourth conductor plug in the same direction as the fourth conductor plug is offset.

4. A semiconductor device according to claim 1, wherein the third conductive pattern and the second conductor plug are formed integral with each other, and the fourth conductive pattern and the fourth conductor plug are formed integral with each other.

5. A semiconductor device according to claim 2, wherein the third conductive pattern and the second conductor plug are formed integral with each other, and the fourth conductive pattern and the fourth conductor plug are formed integral with each other.

6. A semiconductor device according to claim 3, wherein the third conductive pattern and the second conductor plug are formed integral with each other, and the fourth conductive pattern and the fourth conductor plug are formed integral with each other.

7. A semiconductor device according to claim 1, wherein the first conductor plug or the third conductor plug is connected to the gate electrode or the source/drain diffused layer of a transistor positioned below the first conductive pattern or the second conductive pattern.

8. A semiconductor device according to claim 2, wherein the first conductor plug or the third conductor plug is connected to the gate electrode or the source/drain diffused layer of a transistor positioned below the first conductive pattern or the second conductive pattern.

9. A semiconductor device according to claim 3, wherein the first conductor plug or the third conductor plug is connected to the gate electrode or the source/drain diffused layer of a transistor positioned below the first conductive pattern or the second conductive pattern.

10. A semiconductor device comprising:

a first conductive pattern;

a second conductive pattern formed adjacent to the first conductive pattern and being substantially parallel with the first conductive pattern;

a first conductor plug formed below a prescribed region of the first conductive pattern and connected to the first conductive pattern;

a second conductor plug formed over the prescribed region of the first conductive pattern and connected to the first conductive pattern;

a third conductor plug formed below a prescribed region of the second conductive pattern and connected to the second conductive pattern, the prescribed region of the second conductive pattern being adjacent to the prescribed region of the first conductive pattern;

a fourth conductor plug formed over the prescribed region of the second conductive pattern and connected to the second conductive pattern;

a third conductive pattern formed above the first conductive pattern and connected to the second conductor plug; and a fourth conductive pattern formed above the second conductive pattern and connected to the fourth conductor plug, the third conductor plug being arranged at a position which is offset from the first conductor plug, the second conductor plug being positioned in a region above a region where the first conductor plug is formed, and the fourth conductor plug being positioned in a region above a region where the third conductor plug is formed.

11. A semiconductor device according to claim 10, comprising:

a fifth conductive pattern formed adjacent to the second conductive pattern and being substantially parallel with the second conductive pattern;

a fifth conductor plug formed below a prescribed region of the fifth conductive pattern and connected to the fifth conductive pattern, the prescribed region of the fifth conductive pattern being adjacent to the prescribed region of the second conductive pattern;

a sixth conductor plug formed over the prescribed region of the fifth conductive pattern and connected to the fifth conductive pattern; and a sixth conductive pattern formed above the fifth conductive pattern and connected to the sixth conductor plug, the fifth conductor plug being offset in the direction opposite to the direction where the third conductor plug is offset, and the sixth conductor plug being positioned in a region above a region where the fifth conductor plug is formed.

12. A semiconductor device according to claim 10, comprising:

a fifth conductive pattern formed adjacent to the second conductive pattern and being substantially parallel with the second conductive pattern;

a fifth conductor plug formed in a prescribed region of the fifth conductive pattern and connected to the fifth conductive pattern, the prescribed region of the fifth conductive pattern being adjacent to the prescribed region of the second conductive pattern;

a sixth conductor plug formed above the prescribed region of the fifth conductive pattern and connected to the fifth conductive pattern; and a sixth conductive pattern formed above the fifth conductive pattern and connected to the sixth conductor plug, the fifth conductor plug being arranged at a position which is offset in the same direction as the third conductor plug is offset, and the sixth conductor plug being positioned in a region above a region where the fifth conductor plug is formed.

13. A semiconductor device according to claim 10, wherein the first conductive pattern and the first conductor plug are formed integral with each other, the second conductive pattern and the third conductor plug are formed integral with each other, the third conductive pattern and the second conductor plug are formed integral with each other, and the fourth conductive pattern and the fourth conductor plug are formed integral with each other.

14. A semiconductor device according to claim 11, wherein the first conductive pattern and the first conductor plug are formed integral with each other, the second conductive pattern and the third conductor plug are formed integral with each other, the third conductive pattern and the second conductor plug are formed integral with each other, and the fourth conductive pattern and the fourth conductor plug are formed integral with each other.

15. A semiconductor device according to claim 12, wherein the first conductive pattern and the first conductor plug are formed integral with each other, the second conductive pattern and the third conductor plug are formed integral with each other, the third conductive pattern and the second conductor plug are formed integral with each other, and the fourth conductive pattern and the fourth conductor plug are formed integral with each other.

* * * * *